United States Patent
Yoo

(10) Patent No.: US 8,941,172 B2
(45) Date of Patent: Jan. 27, 2015

(54) NON-VOLATILE MEMORY DEVICE AND METHOD OF MANUFACTURING THE SAME

(75) Inventor: Hyun Seung Yoo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 162 days.

(21) Appl. No.: 13/541,873

(22) Filed: Jul. 5, 2012

(65) Prior Publication Data

US 2013/0009235 A1  Jan. 10, 2013

(30) Foreign Application Priority Data

Jul. 6, 2011  (KR) .......................... 10-2011-0066804

(51) Int. Cl.
*H01L 29/72* (2006.01)
*H01L 27/115* (2006.01)
*H01L 29/792* (2006.01)
*G11C 16/04* (2006.01)

(52) U.S. Cl.
CPC ...... *H01L 27/11582* (2013.01); *H01L 29/7926* (2013.01); *G11C 16/0466* (2013.01)
USPC ..................................... 257/329; 365/185.05

(58) Field of Classification Search
USPC ..................................... 257/329; 365/185.05
See application file for complete search history.

(56) References Cited

U.S. PATENT DOCUMENTS

2010/0171163 A1* 7/2010 Kim et al. ..................... 257/314
2012/0292686 A1* 11/2012 Son et al. ...................... 257/316

* cited by examiner

*Primary Examiner* — Edward Wojciechowicz
(74) *Attorney, Agent, or Firm* — William Park & Associates Patent Ltd.

(57) ABSTRACT

A non-volatile memory device includes first and second vertical channel layers generally protruding upwardly from a semiconductor substrate substantially in parallel; a first gate group configured to include a plurality of memory cell gates which are stacked substantially along the first vertical channel layer and are isolated from each other with an interlayer insulating layer interposed substantially between the memory cell gates; a second gate group configured to include a plurality of memory cell gates which are stacked substantially along the second vertical channel layer and are isolated from each other with the interlayer insulating layer interposed substantially between the memory cell gates; a pipe channel layer configured to couple the first and the second vertical channel layers; and a channel layer extension part generally extended from the pipe channel layer to the semiconductor substrate and configured to couple the pipe channel layer and the semiconductor substrate.

11 Claims, 34 Drawing Sheets

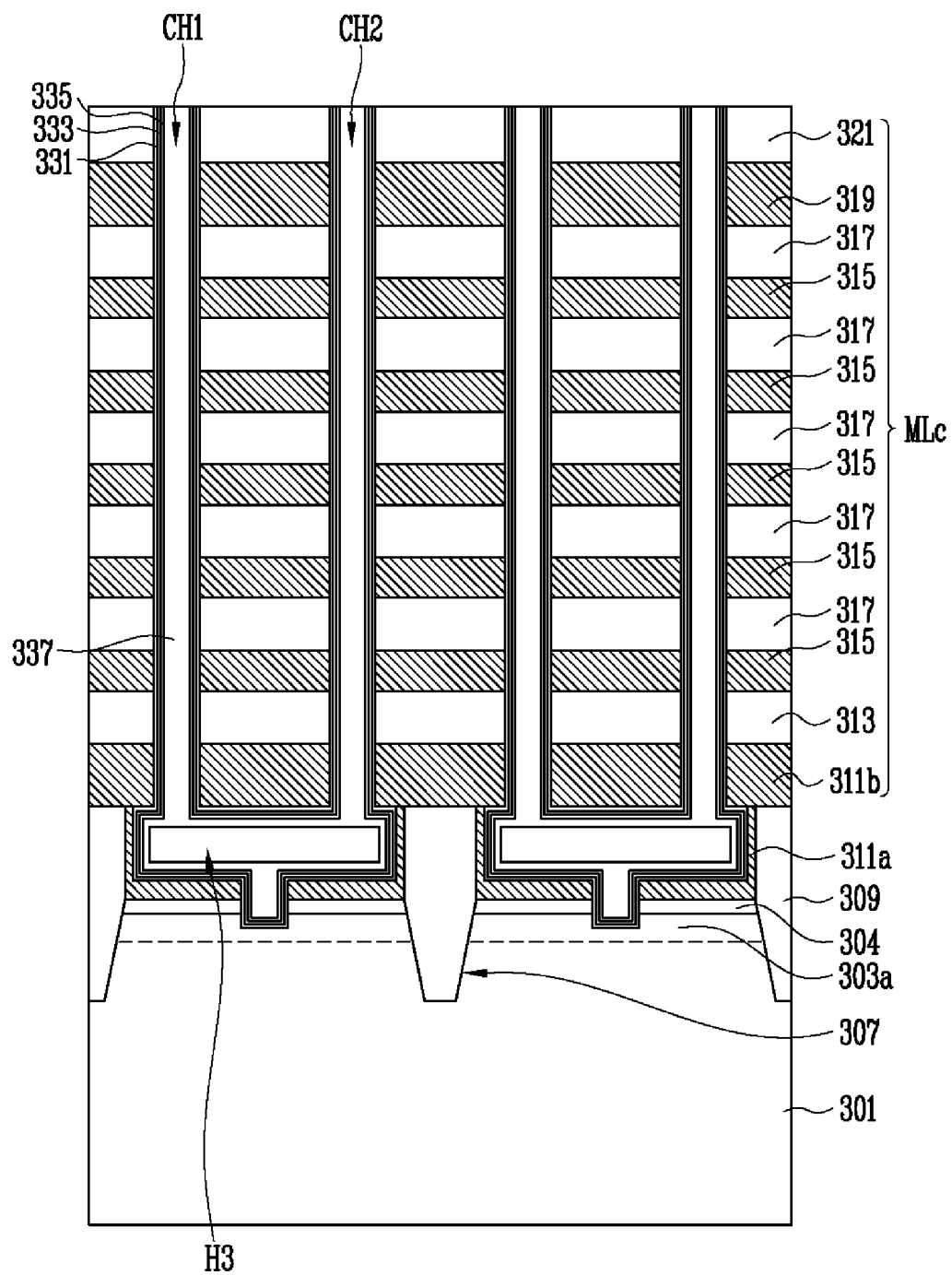

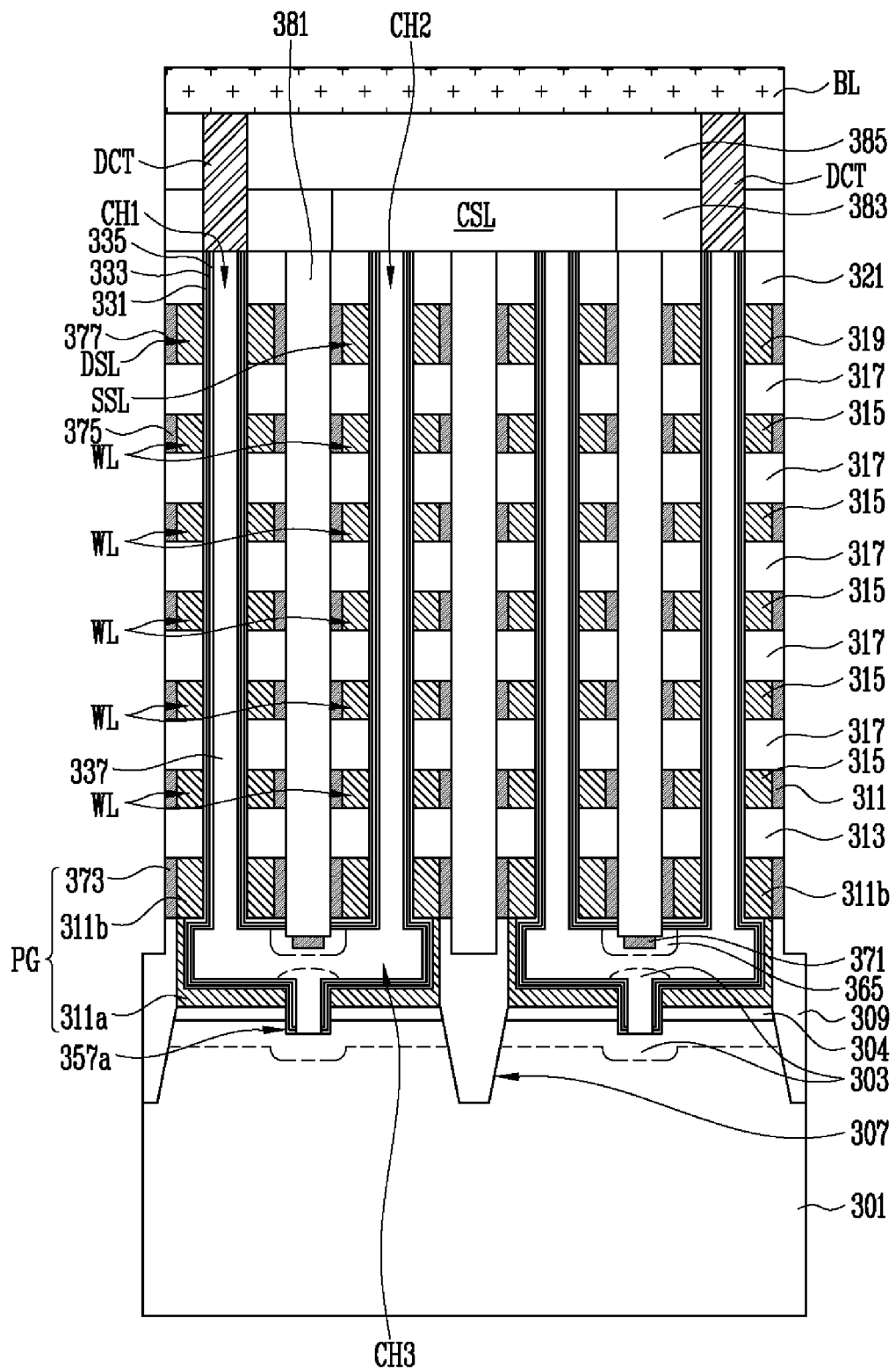

NON-VOLATILE MEMORY DEVICE AND METHOD OF MANUFACTURING THE SAME

CROSS-REFERENCE TO RELATED APPLICATION

The present application claim priority to Korean patent application number 10-2011-0066804 filed on Jul. 6, 2011, the entire disclosure of which is incorporated herein by reference in its entirety.

BACKGROUND

1. Technical Field

Embodiments of this disclosure relate generally to a non-volatile memory device and a method of manufacturing the same and, more particularly, to a non-volatile memory device having a three-dimensional (3-D) structure and a method of manufacturing the same.

2. Related Art

As the memory device field, such as non-volatile memory devices, is advanced, there is an increasing demand for the high degree of integration of the memory devices. In a known art, the degree of integration of memory devices within a certain area is increased by using a method of reducing the size of memory cells which are arranged over a semiconductor substrate in a two-dimensional (2-D) manner. A reduction in the size of the memory cells, however, is physically limited. For this reason, there is recently proposed a method of high integrating memory devices by arranging memory cells over a semiconductor substrate in a 3-D manner. If, as described above, the memory cells are arranged in a 3-D manner, the area of the semiconductor substrate can be efficiently utilized and the degree of integration can be improved as compared with the memory cells arranged in a 2-D manner.

From among 3-D non-volatile memory devices, a 3-D non-volatile memory device having U-shaped memory strings includes U-shaped channel layers. Each of the U-shaped channel layers includes first and second vertical channel layers and a pipe channel layer for coupling the first and the second vertical channel layers. The 3-D non-volatile memory device further includes a plurality of cell gates formed along each of the first and the second vertical channel layers and stacked and isolated from each other with an interlayer insulating layer interposed therebetween and select gates formed on both ends of the U-shaped channel layer. The cell gates and the select gates are formed to surround the U-shaped channel layer. A memory layer is formed between the cell gates and the U-shaped channel layer. The memory layer includes a tunnel insulating layer formed to adjoin the outer wall of the U-shaped channel layer and surround the U-shaped channel layer, a charge trap layer formed to surround the tunnel insulating layer, and a blocking insulating layer formed to surround the charge trap layer. A gate insulating layer is further formed between the cell gates and the U-shaped channel layer.

The 3-D non-volatile memory device can store data by injecting electrons into the charge trap layer formed at the crossing of the cell gates and the U-shaped channel layer and can erase data by discharging electric charges, injected into the charge trap layer, from the charge trap layer toward the U-shaped channel layer. In particular, in order to generate holes on the select gate side in an erase operation, Gate Induced Drain Leakage (GIDL) is induced, and the generated holes are introduced into the U-shaped channel layer. Accordingly, a potential difference is generated between the U-shaped channel layer and the charge trap layer, so that the electrons within the charge trap layer are discharged. In this erase operation, however, there are disadvantages in that erase operation signals have complicated waveforms and the erase time is increased in order to induce the GIDL and the reliability of the select gate is deteriorated.

BRIEF SUMMARY

An embodiment of this disclosure relates to a 3-D non-volatile memory device and a method of manufacturing the same, which are capable of improving the erase speed of the non-volatile memory device having generally U-shaped memory strings.

In an embodiment of this disclosure, a non-volatile memory device includes a first vertical channel layer and a second vertical channel layer, both of which, generally protrude upwardly from a semiconductor substrate substantially in parallel; a first gate group configured to include a plurality of memory cell gates which are stacked substantially along the first vertical channel layer and are isolated from each other with an interlayer insulating layer interposed substantially between the memory cell gates; a second gate group configured to include a plurality of memory cell gates which are stacked substantially along the second vertical channel layer and are isolated from each other with the interlayer insulating layer interposed substantially between the memory cell gates; a pipe channel layer configured to couple the first vertical channel layer and the second vertical channel layer; and a channel layer extension part generally extended from the pipe channel layer to the semiconductor substrate and configured to couple the pipe channel layer and the semiconductor substrate.

In another embodiment of this disclosure, a method of manufacturing a non-volatile memory device includes forming a sacrificial layer pattern substantially over a semiconductor substrate; forming a stack structure by alternately stacking a plurality of first and second material layers substantially over the sacrificial layer pattern; forming first and second channel holes configured to penetrate the stack structure and to have the sacrificial layer pattern substantially exposed therethrough; forming a pipe channel hole by substantially removing the sacrificial layer pattern; forming a semiconductor layer generally on a surface of the pipe channel hole and substantially within the first and the second channel holes; forming a slit configured to penetrate the stack structure substantially between the first and the second channel holes and the semiconductor layer and extended down to the semiconductor substrate; and substantially filling the pipe channel hole and a part of the slit, extended from the pipe channel hole to the semiconductor substrate, with a semiconductor layer.

In yet another embodiment of this disclosure, a method of manufacturing a non-volatile memory device includes forming a first pipe gate layer substantially over or in a semiconductor substrate; forming a first trench generally within the first pipe gate layer by etching the first pipe gate layer; forming a second trench generally extending from the first trenche to the semiconductor substrate; forming a sacrificial layer pattern substantially in the first and the second trenches; forming a stack structure by alternately stacking a plurality of first and second material layers substantially over an entire structure including the sacrificial layer pattern; forming first and second channel holes configured to penetrate the stack structure and to have the sacrificial layer pattern exposed therethrough; opening the first and the second trenches by substantially removing the sacrificial layer pattern; forming a semiconductor layer substantially on a surface of the first trench, generally within the second trench, and generally within the first and the second channel holes; forming a slit configured to penetrate the stack structure substantially between the first and the second channel holes and the semiconductor layer within the second trench and extended down to the semiconductor substrate; and substantially filling the first and the second trenches and a part of the slit, extended from the second trenche to the semiconductor substrate, with a semiconductor layer.

BRIEF DESCRIPTION OF THE DRAWINGS

FIGS. 9A to 9F are diagrams illustrating a method of manufacturing the non-volatile memory device illustrated in FIG. 8;

FIGS. 10A to 10C are diagrams illustrating another method of manufacturing the non-volatile memory device illustrated in FIG. 8.

DESCRIPTION OF EMBODIMENTS

Figure 1:
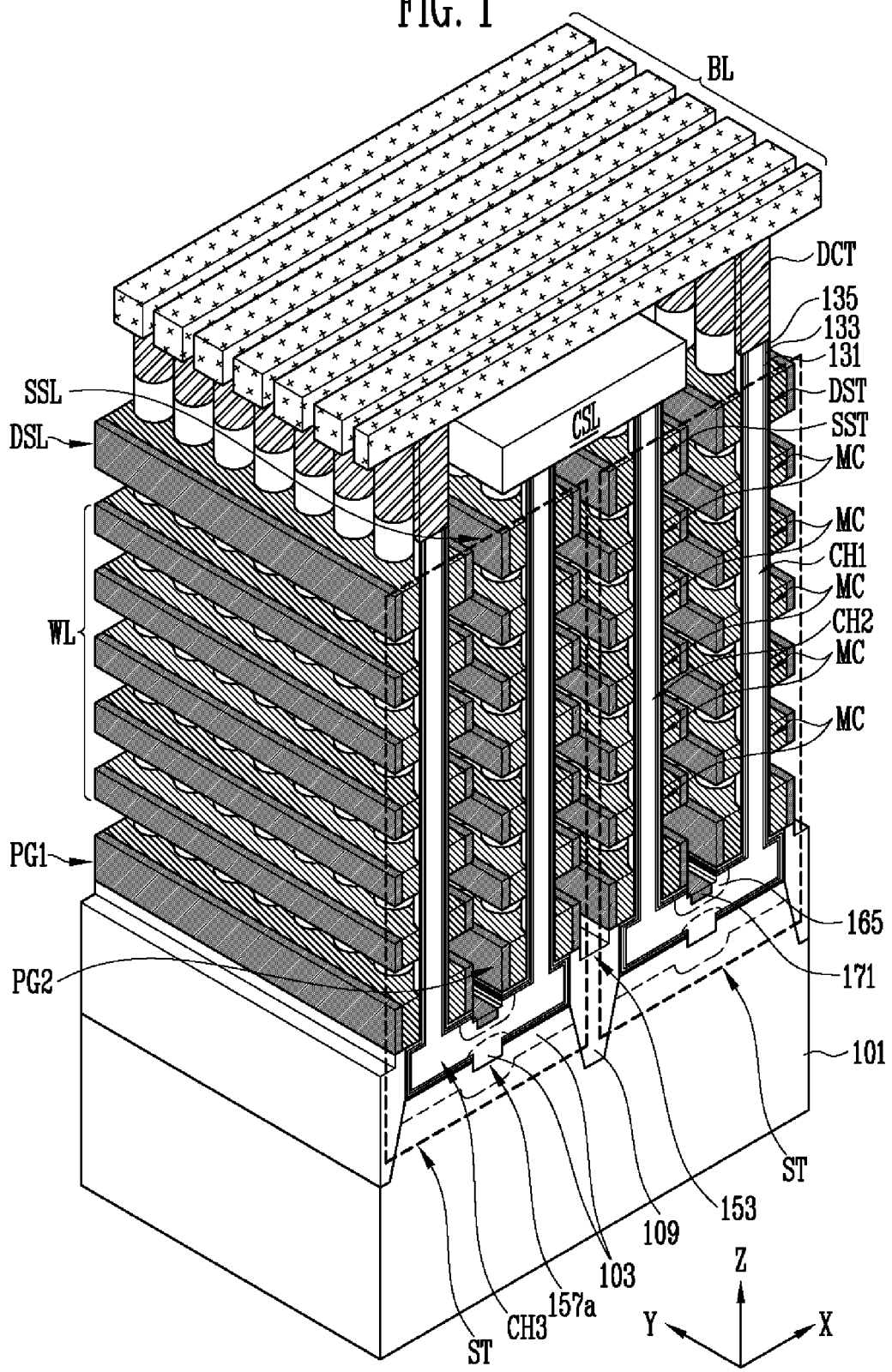
FIG. 1 is a diagram illustrating a non-volatile memory device according to a first embodiment of this disclosure.

Hereinafter, various embodiments of the present disclosure will be described with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Meanwhile, it may be understood that when one element, such as a layer, is referred to as being 'on (or over)' the other element (for example, a semiconductor substrate), it may directly come in contact with the other element, or a third element or elements may be interposed between the two elements etc. Furthermore, in the drawings, the size and thickness of each layer is enlarged, for ease of description and clarity, and the same reference numerals designate the same elements throughout the drawings. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added In the following drawings, directions are described using an XYZ rectangular coordinate system. Two directions generally parallel to a top surface of a semiconductor substrate and generally orthogonal to each other are assumed to be generally in the X and Y directions, and a direction generally orthogonal to the X and Y directions and generally parallel to a direction where conductive layers and insulating layers are stacked is assumed to be generally in a Z direction.

FIG. 1 is a diagram illustrating a non-volatile memory device according to a first embodiment of this disclosure. It is to be noted that parts of insulating layers are not illustrated in FIG. 1, for the sake of convenience.

Referring to FIG. 1, the non-volatile memory device according to the first embodiment may include a plurality of memory strings ST arranged substantially in a matrix form including a plurality of columns and a plurality of rows. Each of the memory strings ST may include a channel layer coupled to a semiconductor substrate 101. The channel layer of the memory string ST may include a generally U-shaped channel layer and a channel layer extension unit 157a. The generally U-shaped channel layer may include first and second vertical channel layers CH1 and CH2 and a pipe channel layer CH3 formed to couple the first and the second vertical channel layers CH1 and CH2 together. The first and the second vertical channel layers CH1 and CH2 may upwardly protrude from the semiconductor substrate 101, formed substantially in parallel in generally the Z direction, and may be spaced apart from each other. The channel layer extension unit 157a may be extended from the pipe channel layer CH3 to the semiconductor substrate 101 and may be configured to couple the pipe channel layer CH3 and the semiconductor substrate 101 together.

The memory string ST may include a drain select transistor DST formed substantially at the top of the first vertical channel layer CH1, a source select transistor SST formed substantially at the top of the second vertical channel layer CH2, a first memory cell group formed to include a plurality of memory cells MC stacked generally in a row along the first vertical channel layer CH1 substantially between the semiconductor substrate 101 and the drain select transistor DST, a second memory cell group formed to include a plurality of memory cells MC stacked generally in a row along the second vertical channel layer CH2 substantially between the semiconductor substrate 101 and the source select transistor SST, and a pipe transistor formed substantially between the first and the second memory cell groups.

The gate of the drain select transistor DST is formed to substantially surround the outer wall of the first vertical channel layer CH1 and may be coupled to the drain select line DSL generally extending in the Y direction. A plurality of the drain select transistors DST of the plurality of memory strings ST generally arranged in a row in the Y direction is coupled in common to the drain select line DSL. Furthermore, the gate of the drain select transistor DST may be formed to substantially surround the first vertical channel layer CH1 in the state in which stack layers 131, 133, and 135 (see FIG. 6G, etc.) formed to function as gate insulating layers and to substantially surround the outer wall of the first vertical channel layer CH1 may be interposed generally between the gate of the drain select transistor DST and the first vertical channel layer CH1.

The gate of the source select transistor SST may be formed to substantially surround the outer wall of the second vertical channel layer CH2 and may be coupled to a source select line SSL generally extending in the Y direction. A plurality of the source select transistors SST of the plurality of memory strings ST arranged generally in a row substantially in the Y direction may be coupled in common to the source select line SSL. Furthermore, the gate of the source select transistor SST may be formed to substantially surround the second vertical channel layer CH2 in the state in which the stack layers 131, 133, and 135 formed to function as gate insulating layers and to substantially surround the outer wall of the second vertical channel layer CH2 may be interposed generally between the gate of the source select transistor SST and the second vertical channel layer CH2.

The gates of the first memory cell group may be coupled to word lines WL which may be stacked generally along the first vertical channel layer CH1 and spaced apart from one another with an interlayer insulating layer substantially interposed therebetween. The gates of the second memory cell group may be coupled to the word lines WL which may be stacked along the second vertical channel layer CH2 and spaced apart from one another with an interlayer insulating layer substantially interposed therebetween. The word lines WL coupled to the first gate group of the first memory cell group may be formed to substantially surround the outer wall of the first vertical channel layer CH1 and are generally extended in the Y direction. The word lines WL coupled to the second gate group of the second memory cell group may be formed to substantially surround the outer wall of the second vertical channel layer CH2 and may be generally extended in the Y direction. The word lines WL are formed to substantially surround the first or second vertical channel layer CH1 or CH2 in the state in which the stack layers 131, 133, and 135 used as memory layers are substantially interposed between the word lines WL.

The pipe transistor may include the pipe channel layer CH3 coupling the first and the second vertical channel layers CH1 and CH2. The gate of the pipe transistor may include a first pipe gate PG1 formed generally between the pipe channel layer CH3 and the first memory cell group and a second pipe gate PG2 formed generally between the pipe channel layer CH3 and the second memory cell group. The first pipe gate PG1 may be formed to substantially surround the outer wall of the first vertical channel layer CH1 and may be generally extended in the Y direction. The plurality of memory strings ST generally arranged in a row in the Y direction may be coupled in common to the first pipe gate PG1. Furthermore, the first pipe gate PG1 may be formed to substantially surround the first vertical channel layer CH1 in the state in which the stack layers 131, 133, and 135 formed to function as gate insulating layers and to substantially surround the outer wall of the first vertical channel layer CH1 are interposed substantially between the first pipe gate PG1 and the first vertical channel layer CH1. The second pipe gate PG2 may be formed to substantially surround the outer wall of the second vertical channel layer CH2 and may be generally extended in the Y direction. The plurality of memory strings ST arranged in a row in the Y direction is coupled in common to the second pipe gate PG2. Furthermore, the second pipe gate PG2 may be formed to substantially surround the second vertical channel layer CH2 in the state in which the stack layers 131, 133, and 135 formed to function as gate insulating layers and to substantially surround the outer wall of the second vertical channel layer CH2 may be generally interposed between the second pipe gate PG2 and the second vertical channel layer CH2.

Slits 153 formed generally in the Y direction may be substantially between the drain select line DSL and the source select line SSL, substantially between the first gate group including the word lines WL to substantially surround the first vertical channel layer CH1 and the second gate group including the word lines WL to substantially surround the second vertical channel layer CH2, and substantially between the first and the second pipe gates PG1 and PG2. The slits 153 may generally extend down to the semiconductor substrate 101. Furthermore, each of the slits 153 may be formed substantially in the Y direction substantially between the memory strings ST generally adjacent to each other in substantially the X direction so that the memory strings ST generally adjacent to each other in the X direction may be separated from each other. The stack layers 131, 133, and 135 may be formed to substantially surround the outer walls of the first and the second vertical channel layers CH1 and CH2 and the outer wall of the pipe channel layer CH3 other than the channel layer extension unit 157a.

The memory strings ST, separated from each other with the slit 153 substantially interposed therebetween and generally adjacent to each other, may be symmetrically disposed on the basis of the slit 153. Accordingly, the second vertical channel layers CH2 of the memory strings ST generally adjacent to each other generally in the X direction may be disposed to be generally adjacent to each other, and the first vertical channel layer CH1 of the memory strings ST generally adjacent to each other generally in the X direction may be disposed to be generally adjacent to each other. The second vertical channel layers CH2 forming two columns generally adjacent to each other may be coupled in common to a common source line CSL which may be spaced apart from the source select line SSL over the source select line SSL. The common source line CSL may be generally extended in the Y direction.

The first vertical channel layer CH1 may be coupled to a drain contact plug DCT formed over the first vertical channel layer CH1. The drain contact plug DCT may be coupled to a bit line BL which may be formed generally over the drain contact plug DCT and formed substantially in the X direction.

Although (not shown), an interlayer insulating layer may be formed substantially between the bit line BL and the common source line CSL, substantially between the source select line SSL and the common source line CSL, substantially between the word line WL and the source select line SSL, substantially between the drain select line DSL and the bit line BL, and substantially between the word lines WL stacked so that they are substantially adjacent to each other. Furthermore, a pipe gate insulating layer may be formed substantially between the first gate group and the first pipe gate PG1 and substantially between the second gate group and the second pipe gate PG2.

The drain contact plug DCT may be formed to penetrate the interlayer insulating layer substantially between the bit line BL and the drain select line DSL. The first vertical channel layer CH1 may be formed to penetrate the interlayer insulating layers substantially between the drain contact plug DCT and the pipe channel layer CH3, conductive layers for the first gate group, a conductive layer for the first pipe gate PG1, and the pipe gate insulating layer substantially between the first gate group and the first pipe gate PG1. The second vertical channel layer CH2 may be formed to penetrate the interlayer insulating layers substantially between the common source line CSL and the pipe channel layer CH3, conductive layers for the second gate group, a conductive layer for the second pipe gate PG2, and the pipe gate insulating layer substantially between the second gate group and the second pipe gate PG2.

The first and the second vertical channel layers CH1 and CH2 and the pipe channel layer CH3 may be formed of substantially undoped polysilicon layers. The bit lines BL, the drain contact plugs DCT, and the common source line CSL may be made substantially of metal. The drain select line DSL, the source select line SSL, the word lines WL, and the first and the second pipe gates PG1 and PG2 may be formed of substantially metal layers, or each of them may have a dual layer structure including a polysilicon layer and a metal silicide layer formed substantially on the sidewall of the polysilicon layer. Furthermore, the stack layers 131, 133, and 135 may include a first stack layer 131 which may function as the blocking insulating layer of the memory cell MC, a second stack layer 133 which may function as the charge trap layer of the memory cell MC, and a third stack layer 135 which may function as the tunnel insulating layer of the memory cell MC. The third stack layer 135 may be formed substantially on the outer wall of the Generally U-shaped channel layer, the second stack layer 133 may be formed substantially on the outer wall of the third stack layer 135, and the first stack layer 131 may be formed substantially on the outer wall of the second stack layer 133. Each of the first stack layer 131 and the third stack layer 135 may be formed substantially of an oxide layer, and the second stack layer 133 may be formed substantially of a nitride layer.

The channel layer extension unit 157a formed to fill a part of the slit 153 extending from the pipe channel layer CH3 to the semiconductor substrate 101 may be coupled to a impurity region 103 formed substantially on a surface of the semiconductor substrate 101. Meanwhile, the impurity region 103 may also be formed substantially within the channel layer extension unit 157a. The impurity region 103 is formed by implanting first impurities into the surface of the semiconductor substrate 101. The first impurities may be P-type impurities.

The semiconductor substrate 101 according to this disclosure may be a P-type semiconductor substrate into which P-type impurities have been implanted. Furthermore, the impurity region 103 may be a region into which impurities having a higher concentration than the P-type impurities implanted into the semiconductor substrate 101 have been implanted. The impurity region 103 may be different from a well structure which may be formed by implanting P-type or N-type impurities into a specific depth of the semiconductor substrate 101 for isolation. The first impurities of 1E12 atoms/cm$^2$ to 1E13 atoms/cm$^2$ may be substantially implanted into the impurity region 103 in order to smoothly supply holes in an erase operation.

As described above, in the non-volatile memory device according to the first embodiment, the generally U-shaped channel layers may be coupled to the semiconductor substrate 101, and thus holes can be supplied to the generally U-shaped channel layers in an erase operation. Accordingly, Gate Induced Drain Leakage (GIDL) does not need to be induced on the select gate side so that holes are supplied to the generally U-shaped channel layers in the erase operation. Furthermore, in the non-volatile memory device of the first embodiment, the generally U-shaped channel layers and the semiconductor substrate 101 may be coupled by the slits without occupying an additional space. Thus, the generally U-shaped channel layers and the semiconductor substrate can be coupled without increasing the size of the non-volatile memory device. Meanwhile, the impurity regions 103 formed in the semiconductor substrate 101 may be used as well pick-up regions.

In addition, in the non-volatile memory device according to the first embodiment, a surface of the pipe channel layer CH3 substantially between the first and the second gate groups may substantially be silicided, and a metal silicide layer 171 may be formed generally on the surface of the pipe channel layer CH3. Accordingly, resistance of the pipe channel layer CH3 may be improved.

Furthermore, in the non-volatile memory device according to the first embodiment, an impurity region 165 may be formed in a part of the pipe channel layer CH3 by implanting second impurities generally into a surface of the pipe channel layer CH3 substantially between the first and the second gate groups. If both the impurity region 165 and the metal silicide layer 171 are formed substantially in the pipe channel layer CH3, the impurity region 165 may be formed to substantially surround the surroundings of the metal silicide layer 171. The second impurities and the first impurities are of different type from each other so that the semiconductor substrate 101 and the impurity region 165 form a PN diode. The second impurities may be N-type impurities. Resistance of the pipe channel layer CH3 may be improved by the impurity region 165.

The impurity region 165 or the metal silicide layer 171 according to the first embodiment may couple a channel which is formed in a surface of the pipe channel layer CH3 generally adjacent to the first pipe gate PG1 and a channel which may be formed in a surface of the pipe channel layer CH3 generally adjacent to the second pipe gate PG2, when the memory string ST is operated. In the present embodiment, since the channels may be coupled generally on the top surface of the pipe channel layer CH3 as described above, channel resistance can be improved as compared with the case where channels may be formed generally on the sidewalls and bottom of the pipe channel layer CH3.

In the present embodiment, since channel resistance is improved as described above, the first vertical channel layer CH1 and the second vertical channel layer CH2 do not need to be closely formed in order to secure channel resistance. Thus, a wide interval can be secured substantially between the first memory cell group and the second memory cell group. Accordingly, the present disclosure can improve interference occurring between the first memory cell group and the second memory cell group.

In the non-volatile memory device according to the first embodiment, an isolation layer 109 may be generally formed at each of the boundaries of the memory strings ST in order to improve insulation between the memory strings ST.

Figure 2:
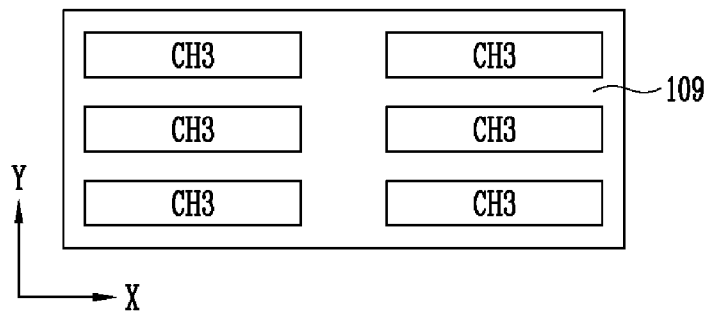
FIG. 2 is a diagram illustrating regions where isolation layers may be formed in the non-volatile memory device according to an embodiment of this disclosure.

FIG. 2 is a diagram illustrating regions where the isolation layers may be formed in the non-volatile memory device according to an embodiment of this disclosure. Referring to FIGS. 1 and 2, the isolation layers 109 may be formed generally in a net form so that they substantially surround the pipe channel layers CH3. Accordingly, the plurality of memory strings ST may be separated from one another by the isolation layers 109 in generally the X direction and the Y direction. Meanwhile, sacrificial layer patterns used as an etch mask to define the regions where the isolation layers 109 will be formed may remain in regions where the isolation layers 109 are not formed. Thus, the first or second pipe gate PG1 or PG2 and the semiconductor substrate 101 may be separated from each other by the sacrificial layer patterns.

A method of operating the non-volatile memory device according to this disclosure is described below with reference to FIGS. 3 to 5.

Figure 3:
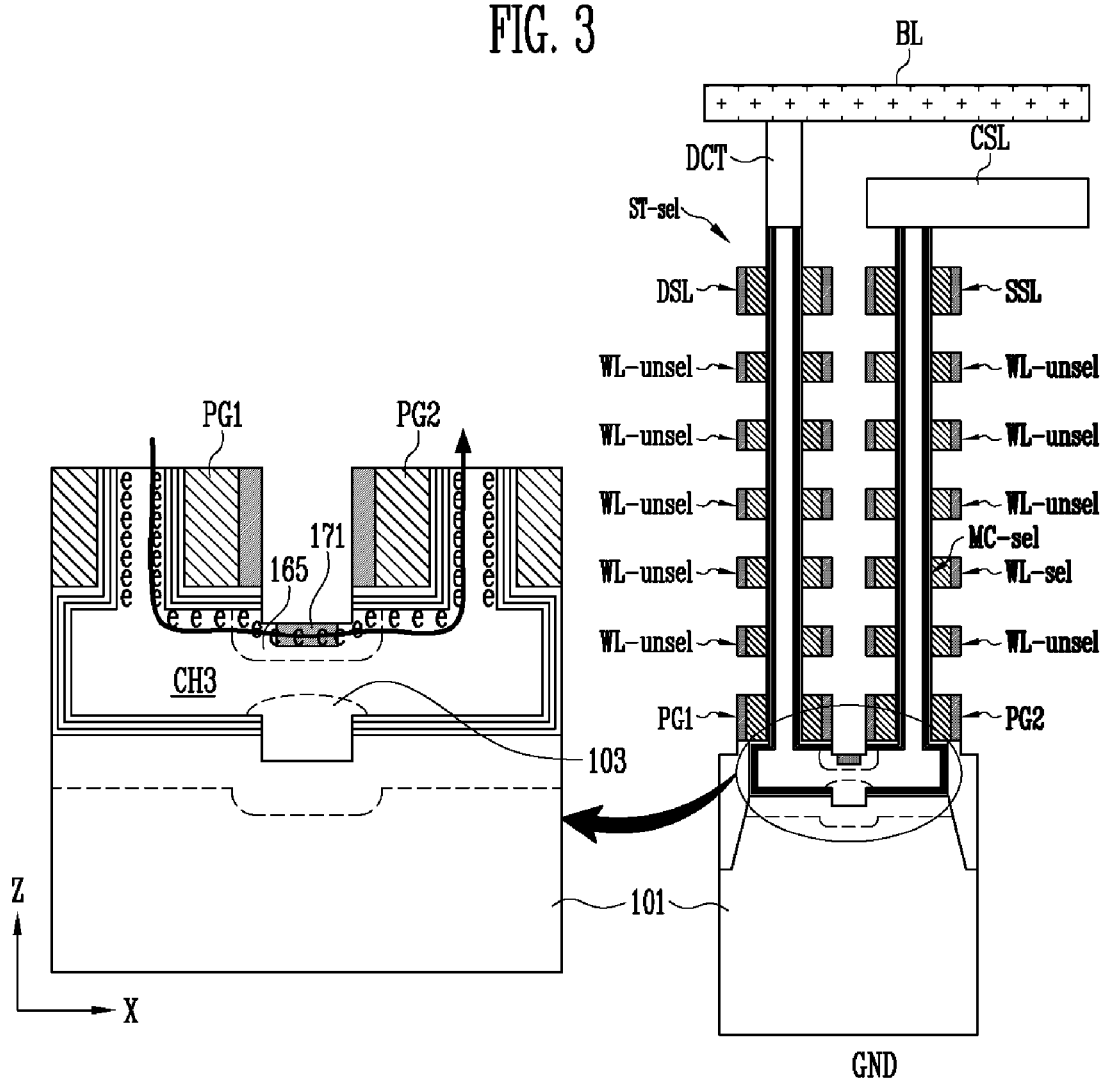
FIG. 3 is a diagram illustrating a read operation of the non-volatile memory device according to an embodiment of this disclosure.

FIG. 3 is a diagram illustrating a read operation of the non-volatile memory device according to an embodiment of this disclosure.

Referring to FIG. 3, in order to read data stored in a selected memory cell MC_sel of a selected memory string ST_sel, a bit line voltage having a specific voltage level (for example, 1 V) may be supplied to the bit line BL, and a ground voltage GND of 0 V may be supplied to the common source line CSL and the semiconductor substrate 101. The voltage may be supplied to the semiconductor substrate 101 through the impurity region 103 of the semiconductor substrate 101. Furthermore, a power source voltage may be supplied to the source select line SSL and the drain select line DSL in order to turn on a source select transistor and a drain select transistor which may be coupled to the selected memory string ST_sel. Furthermore, the power source voltage may be supplied to the first and the second pipe gates PG1 and PG2 in order to turn on the pipe transistors.

Meanwhile, a read voltage Vread may be supplied to a selected word line WL_sel coupled to the selected memory cell MC_sel, and a read pass voltage Vpass may be supplied to the remaining unselected word lines WL_unsel other than the selected word line WL_sel. The read pass voltage Vpass may be set so that all the remaining unselected memory cells other than word line WL_sel are in an on state.

Through the above read operation, channels may be formed on a surface of the pipe channel layer CH3 generally adjacent to the first and the second pipe gates PG1 and PG2. The channel formed generally on the surface of the pipe channel layer CH3 generally adjacent to the first pipe gate PG1 and the channel formed generally on the surface of the pipe channel layer CH3 generally adjacent to the second pipe gate PG2 may be coupled by the impurity region 165 or the metal silicide layer 171. Furthermore, whether current flows from the bit line BL to the common source line CSL may be determined according to whether the threshold voltage of the selected memory cell MC_sel is higher or lower than the read voltage Vread. Consequently, the data stored in the selected memory cell MC_sel may be read out by detecting a change in the potential of the bit line BL.

The present disclosure can improve channel resistance as compared with the case where channels are formed on the sidewalls and bottom of the pipe channel layer CH3 because channels substantially on the surface of the pipe channel layer CH3 are coupled. Accordingly, cell current flowing through the memory string ST_sel can be improved.

Figure 4A:
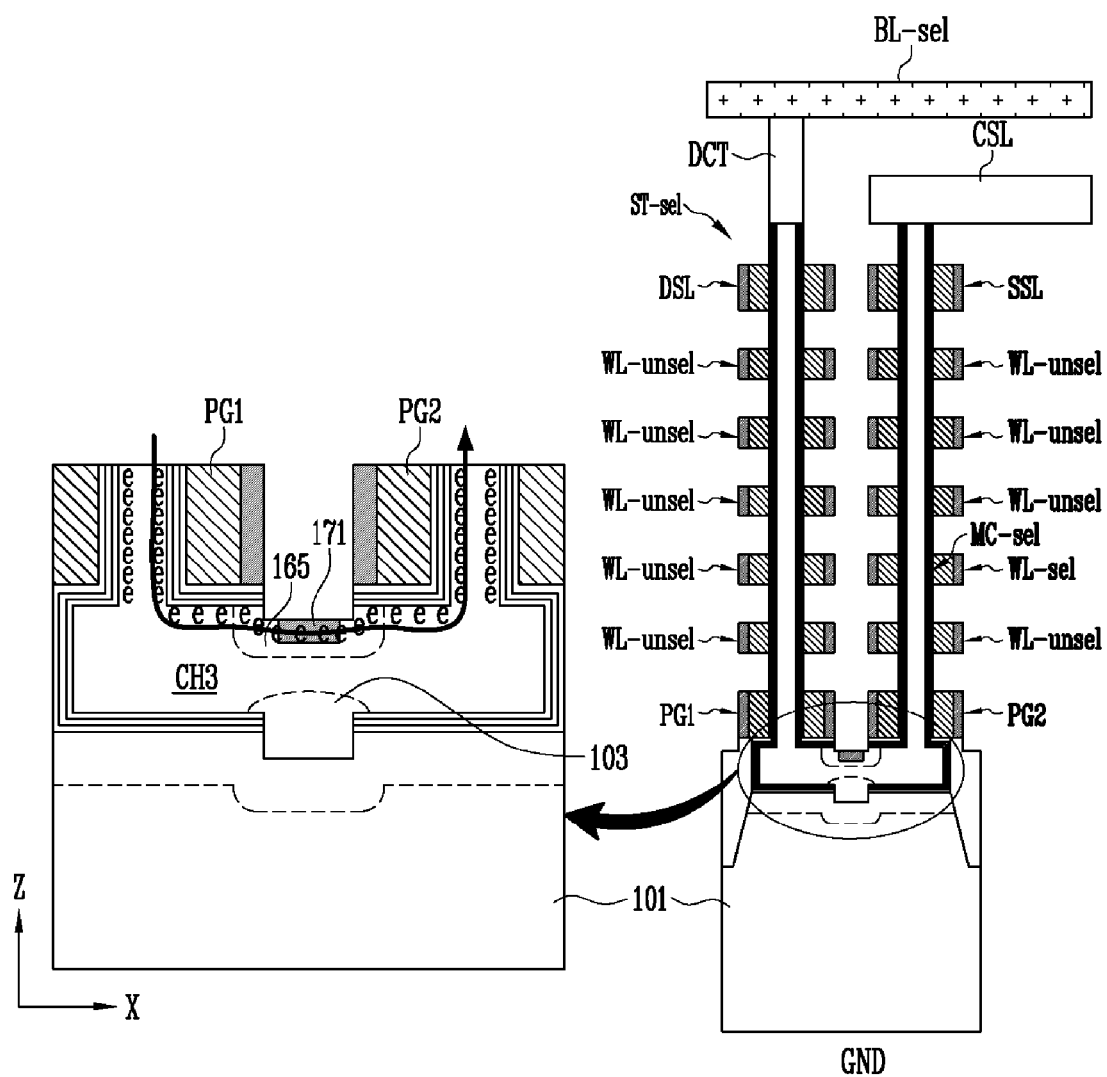
FIGS. 4A and 4B are diagrams illustrating a program operation of the non-volatile memory device according to an embodiment of this disclosure.
Figure 4B:
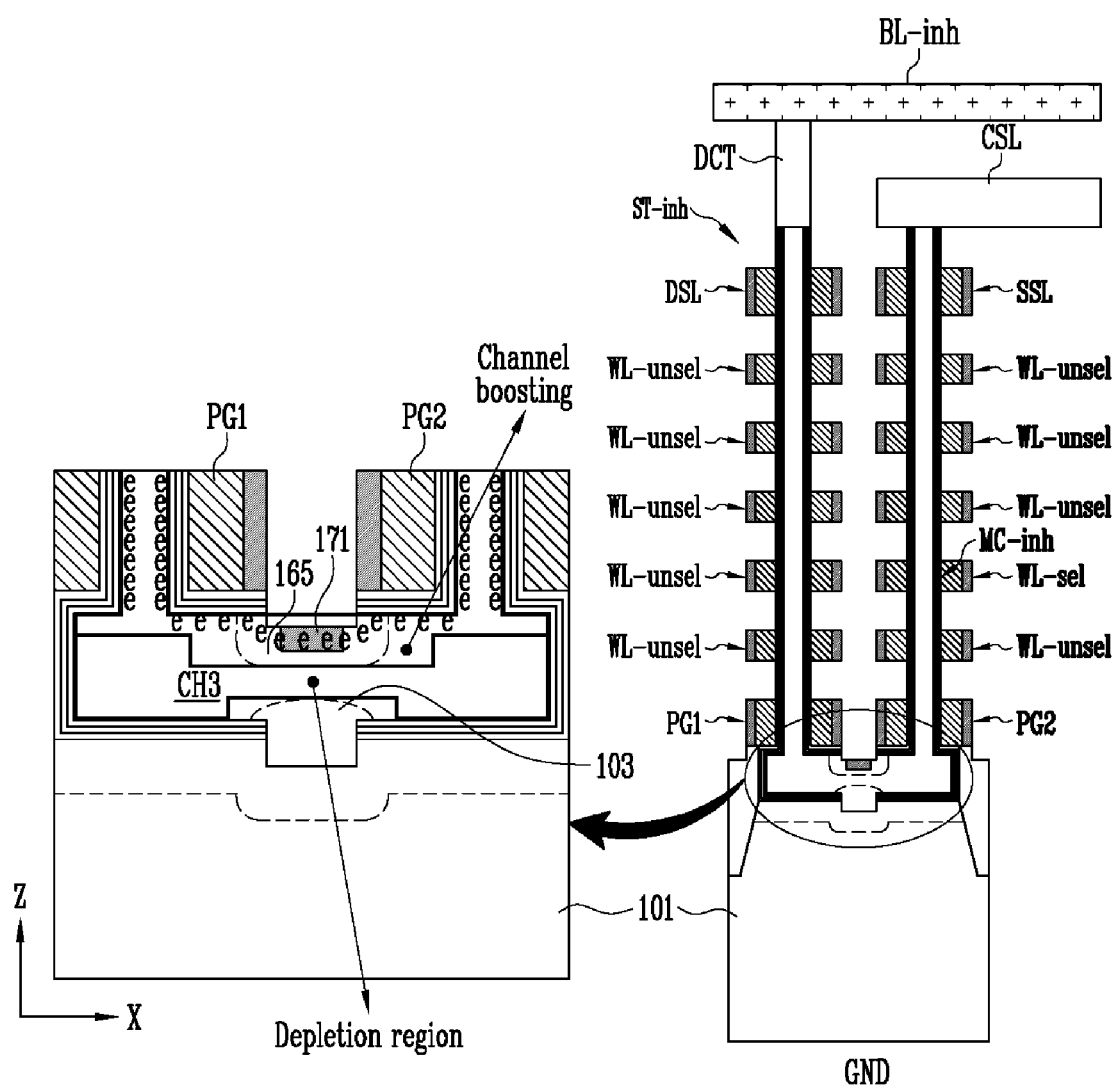

FIGS. 4A and 4B are diagrams illustrating a program operation of the non-volatile memory device according to an embodiment of this disclosure.

Referring to FIG. 4A, if the threshold voltage of a selected memory cell MC_sel of a selected memory string ST_sel is raised and data is sought to be programmed into a selected memory cell MC_sel, a ground voltage GND of 0 V may be supplied to the semiconductor substrate 101 and a selected bit line BL-sel coupled to the selected memory string ST_sel. Furthermore, a power source voltage Vcc may be supplied to the common source line CSL, the power source voltage Vcc may be supplied to the drain select line DSL, and an off voltage may be supplied to the source select line SSL.

Meanwhile, a program voltage Vpgm may be supplied to a selected word line WL_sel coupled to the selected memory cell MC_sel, and a program pass voltage Vpass may be supplied to the remaining unselected word lines WL_unsel other than the selected word line WL_sel. The program pass voltage Vpass may be set so that all the unselected memory cells are in an on state. Furthermore, the pipe transistor may be turned on by supplying the power source voltage Vcc to the first and the second pipe gates PG1 and PG2.

Through the above program operation, a source select transistor coupled to the selected memory string ST_sel may change to an off state, and a drain select transistor coupled thereto may change to an on state. Furthermore, channels may be formed substantially on a surface of the pipe channel layer CH3 generally adjacent to the first and the second pipe gates PG1 and PG2. The channel formed substantially on the surface of the pipe channel layer CH3 generally adjacent to the first pipe gate PG1 and the channel formed substantially on the surface of the pipe channel layer CH3 generally adjacent to the second pipe gate PG2 may be coupled by the impurity region 165 or the metal silicide layer 171. Consequently, the ground voltage of 0 V may be supplied to the channel of the selected memory cell MC_sel, and thus a high voltage difference to the extent that F-N tunneling is generated substantially between the channel of the selected memory cell MC_sel and the selected word line WL_sel may be generated. Accordingly, electrons may be injected into the charge trap layer of the selected memory cell MC_sel, thereby raising the threshold voltage of the selected memory cell MC_sel.

An operation of a program-inhibited memory string ST_inh, coupled to a selected word line WL_sel and formed to include a program-inhibited cell MC_inh whose threshold voltage should not rise, is described below with reference to FIG. 4B.

A power source voltage Vcc having a specific level may be supplied to a program-inhibited bit line BL-inh coupled to the program-inhibited memory string ST-inh. At this time, a ground voltage GND of 0 V may be supplied to the semiconductor substrate 101, and the power source voltage Vcc may be supplied to the common source line CSL. Furthermore, the power source voltage Vcc may be supplied to the drain select line DSL, and an off voltage may be supplied to the source select line SSL. Furthermore, a program voltage Vpgm may be supplied to the selected word line WL_sel coupled to the program-inhibited cell MC_inh, and a program pass voltage Vpass may be supplied to the remaining unselected word lines WL_unsel other than the selected word line WL_sel. Furthermore, the power source voltage Vcc may be supplied to the first and the second pipe gates PG1 and PG2 so that the pipe transistor changes to an on state.

Through the above program operation, a source select transistor coupled to the program-inhibited memory string ST_inh changes to an off state. Furthermore, the channel voltage of the program-inhibited memory string ST_inh may have substantially the same voltage level as the difference between voltage of the program-inhibited bit line BL_inh and the threshold voltage of the drain select transistor. Accordingly, the drain select transistor coupled to the program-inhibited memory string ST_inh becomes a cut-off state. Consequently, a capacitance coupling phenomenon may be generated substantially between the channel of the program-inhibited memory string ST_inh and the gates WL_unsel, WL_sel, PG1, and PG2 of the program-inhibited memory string ST_inh. The channel voltage of the program-inhibited memory string ST_inh may be boosted and raised by the capacitance coupling phenomenon. When the channel voltage of the program-inhibited memory string ST_inh is boosted as described above, a depletion region may be generated within the pipe channel CH3 neighboring the impurity region 103. Consequently, insulation between the program-inhibited memory string ST_inh and the semiconductor substrate 101 may be automatically secured. Meanwhile, F-N tunneling may not be generated because a voltage difference between the selected word line WL_sel and the program-inhibited memory cell MC-inh may be small owing to the booted channel voltage. Accordingly, the threshold voltage of the program-inhibited memory cell MC-inh may be prevented from rising.

Figure 5:
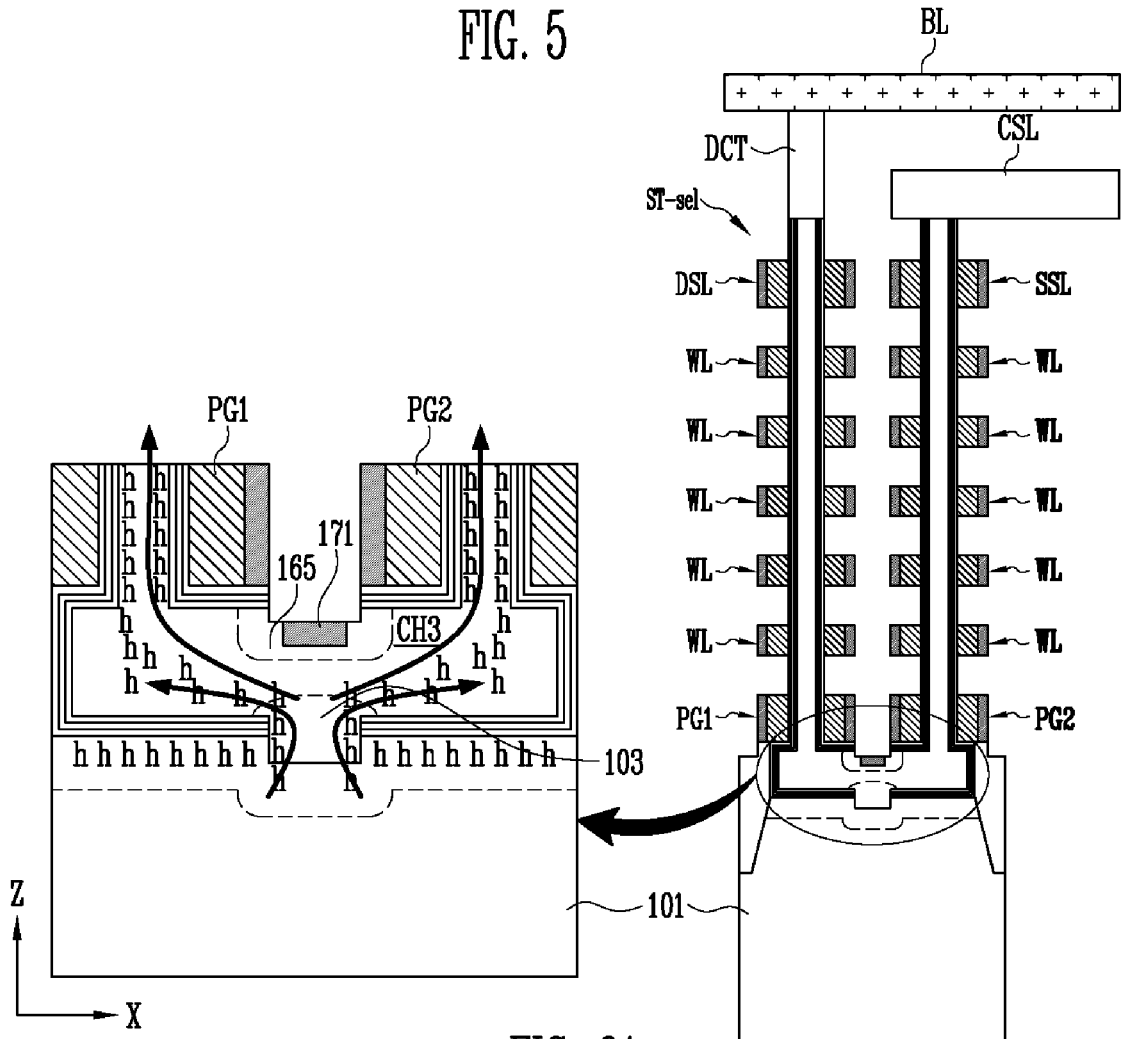
FIG. 5 is a diagram illustrating an erase operation of the non-volatile memory device according to an embodiment of this disclosure.

FIG. 5 is a diagram illustrating an erase operation of the non-volatile memory device according to an embodiment of this disclosure. The erase operation may be performed for each memory block. The memory block may include a plurality of memory strings coupled in parallel to the common source line CSL.

Referring to FIG. 5, in order to perform the erase operation, the bit line BL, the drain select line DSL, and the source select line SSL of a selected memory block are floated, and a ground voltage GND of 0 V may be supplied to the word line WL and the first and the second pipe gates PG1 and PG2. Furthermore, an erase voltage Vers having a high potential may be supplied to the semiconductor substrate 101. Accordingly, holes h within the impurity region 103 may be injected into the Generally U-shaped channel layer. Consequently, electrons stored in memory cells may be discharged to the Generally U-shaped channel layer owing to a voltage difference between the Generally U-shaped channel layer and the word line WL, so that data stored in the memory cells may be collectively erased.

As described above, in the present disclosure, the holes h may be supplied from the semiconductor substrate 101 to the Generally U-shaped channel layers in the erase operation. Thus, in the erase operation, Gate Induced Drain Leakage (GIDL) does not need to be induced on the select gate side so that the holes may be supplied to the Generally U-shaped channel layers. In the non-volatile memory device according to this disclosure, the erase speed can be increased and the reliability of the select gate can be improved because erase operation signals may have simple waveforms.

Figure 6A:
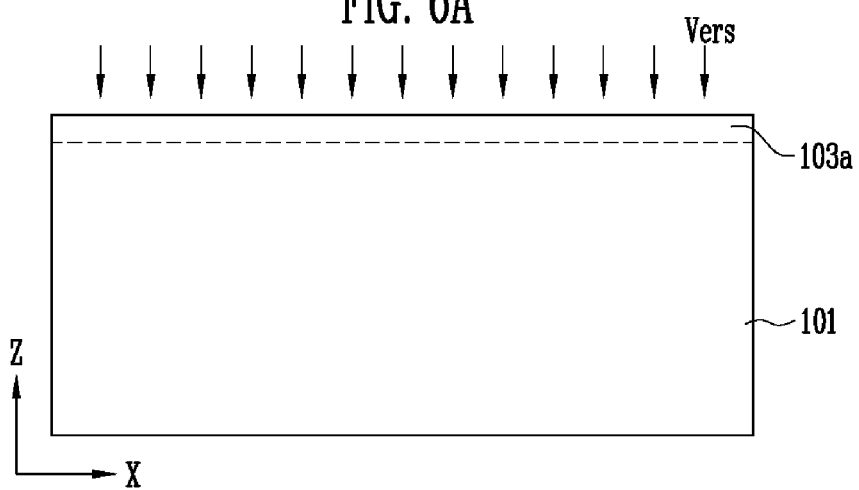
FIGS. 6A to 6O are diagrams illustrating a method of manufacturing the non-volatile memory device illustrated in FIG. 1.

FIGS. 6A to 6O are diagrams illustrating a method of manufacturing the non-volatile memory device illustrated in FIG. 1.

Referring to FIG. 6A, a first impurity region 103a may be formed by implanting P-type impurities into a surface of a P-type semiconductor substrate 101 made of monocrystalline silicon. The first impurity region 103a may function as the well pick-up of the non-volatile memory device or may function to improve the supply of holes to the channel layers in an erase operation. It may be preferred that the first impurity region 103a be formed by implanting the P-type impurities of 1E12 atoms/cm$^2$ to 1E13 atoms/cm$^2$ with energy of 20 KeV to 80 KeV.

Figure 6B:
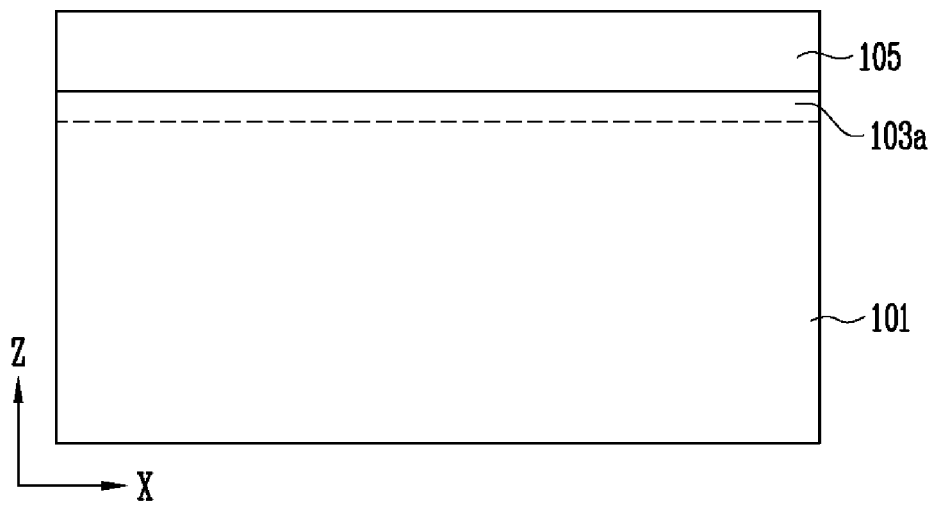

Referring to FIG. 6B, a sacrificial layer 105 may be formed substantially over the first impurity region 103a. It may be preferred that the sacrificial layer 105 be a nitride layer which may function as an etch mask in a subsequent process of etching the semiconductor substrate 101.

Figure 6C:
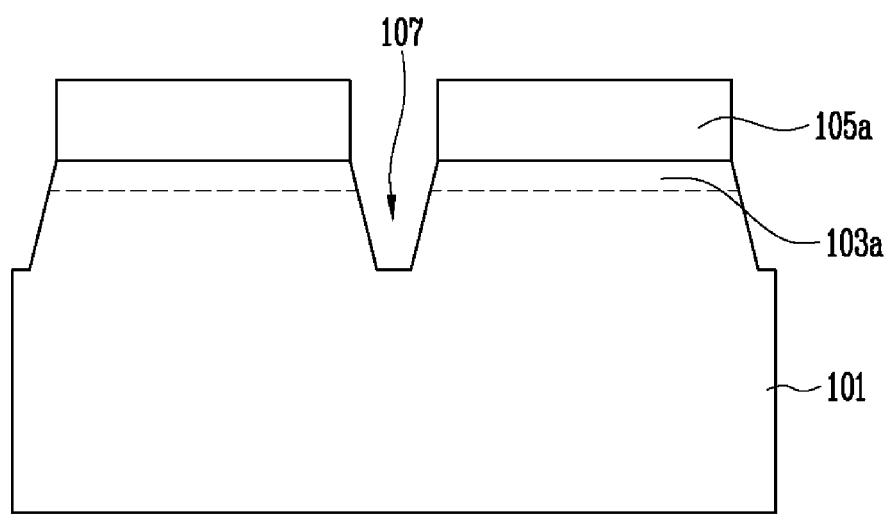

Referring to FIG. 6C, sacrificial layer patterns 105a may be formed by patterning the sacrificial layer 105 through a photolithography process. The sacrificial layer patterns 105a may be patterns through which the isolation regions of the semiconductor substrate 101 are generally exposed and may be used as first hard mask patterns which may function as an etch mask in a subsequent process. Isolation trenches 107 may be formed in the semiconductor substrate 101 by etching the isolation regions of the semiconductor substrate 101 which may be substantially exposed through the sacrificial layer patterns 105a. It may be preferred that the isolation trenches 107 be deeper than the first impurity region 103a. The isolation trenches 107 may define regions where the isolation layers will be formed.

Figure 6D:
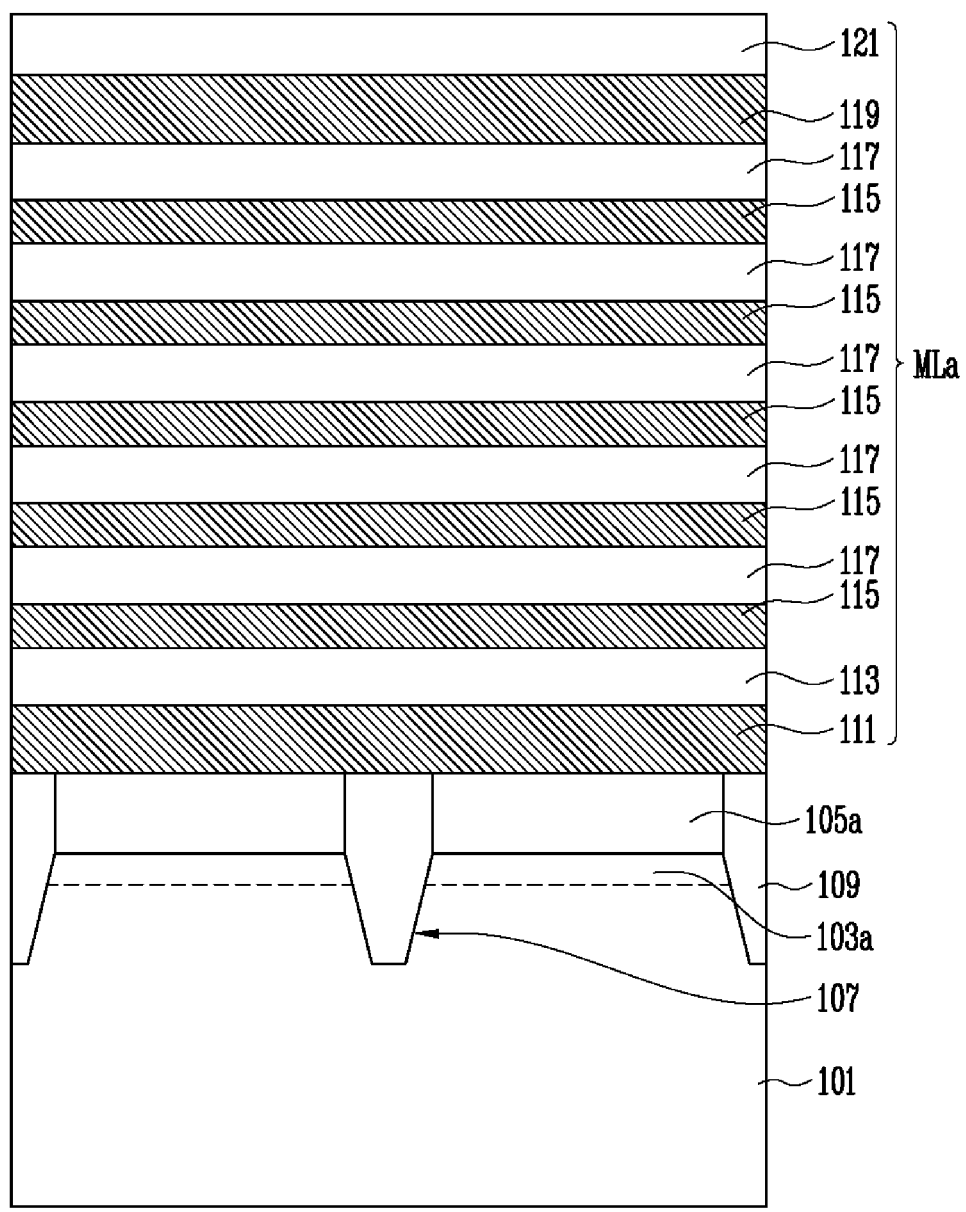

Referring to FIG. 6D, an insulating material having a sufficient thickness may be formed substantially over the entire structure so that the inside of the isolation trenches 107 may be filled. Isolation layers 109 may be formed substantially within the isolation trenches 107 by removing the insulating material on the sacrificial layer patterns 105a so that the sacrificial layer patterns 105a are substantially exposed. The insulating material for the isolation layers 109 may be an oxide layer. Furthermore, a polishing process, such as Chemical Mechanical Polishing (CMP), may be performed in order to substantially remove the insulating material on the sacrificial layer patterns 105a.

Next, a stack structure MLa may be formed by alternately stacking a plurality of first and second material layers substantially over the isolation layers 109 and the sacrificial layer patterns 105a. The first material layers may be a plurality of gate conductive layers 111, 115, and 119, and the second material layers may be a plurality of interlayer insulating layers 113, 117, and 121. The lowest layer of the plurality of gate conductive layers 111, 115, and 119 may be a pipe gate layer 111, the highest layer of the plurality of gate conductive layers 111, 115, and 119 may be a select gate layer 119, and the gate conductive layer between the pipe gate layer 111 and the select gate layer 119 may be cell a gate layer 115. The lowest layer of the plurality of interlayer insulating layers 113, 117, and 121 may be a pipe gate insulating layer 113. The number of each of the cell gate layers 115 and the interlayer insulating layers 117 between the pipe gate insulating layer 113 and the select gate layer 119 of the stack structure MLa may vary according to the number of memory cells to be stacked.

The plurality of gate conductive layers 111, 115, and 119 may be polysilicon layers or metal layers. Furthermore, the plurality of interlayer insulating layers 113, 117, and 121 may be formed substantially of oxide layers.

Figure 6E:
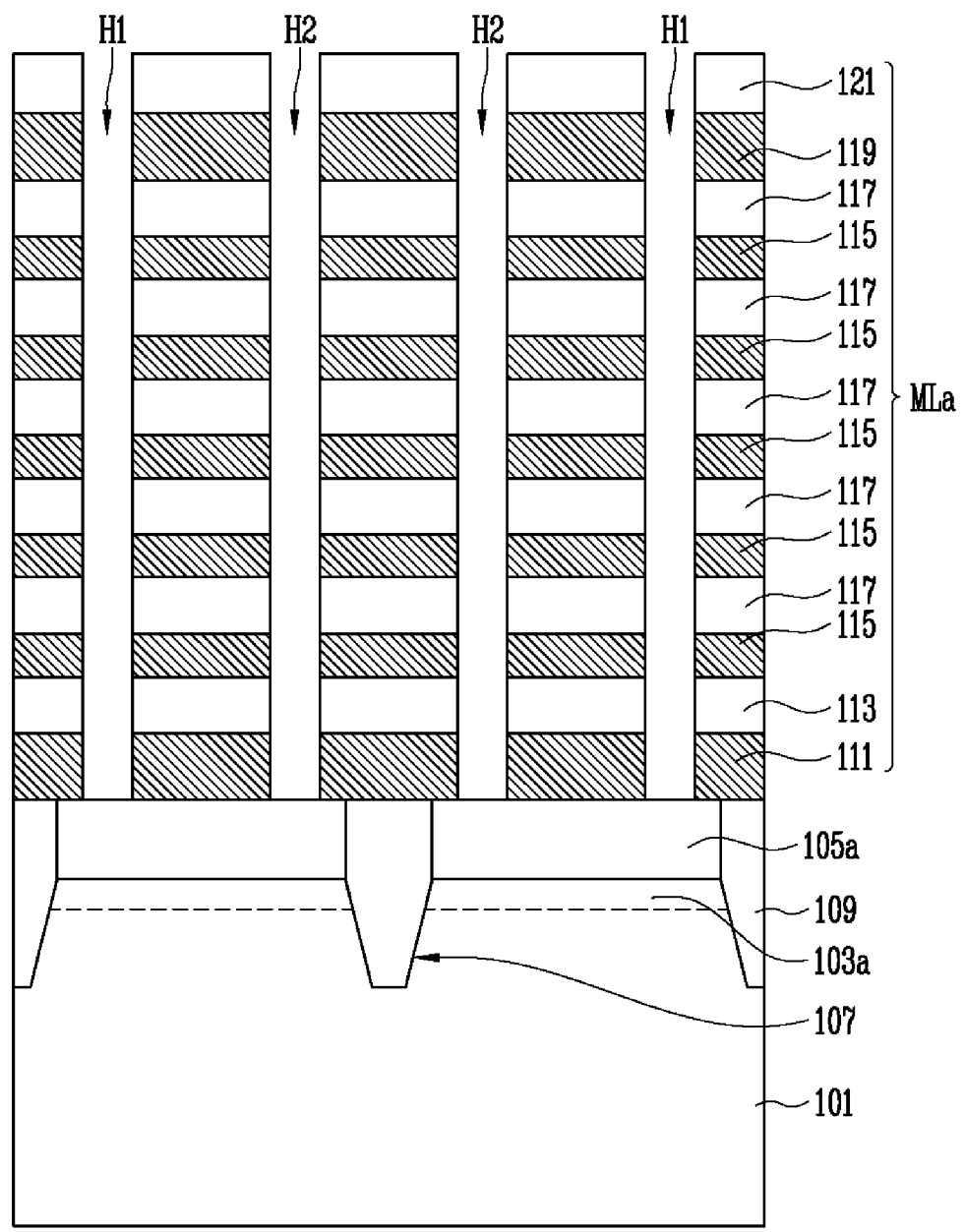

Referring to FIG. 6E, a plurality of first channel holes H1 and a plurality of second channel holes H2 which substantially penetrate the stack structure MLa may be formed by an etch process. The etch process for forming the first and the second channel holes H1 and H2 may be performed as follows. First, second hard mask patterns (not shown) may be formed substantially on the interlayer insulating layers 121 using a photolithography process. Next, an etch process may be stopped when the sacrificial layer patterns 105a, that is, nitride layers are substantially exposed by using the second hard mask patterns as an etch mask may be performed.

Vertical holes forming a pair of the first and the second channel holes H1 and H2 may be formed substantially over each of the sacrificial layer patterns 105a separated from each other by the isolation layer 109. Furthermore, the first and the second channel holes H1 and H2 may be formed generally in parallel.

Figure 6F:
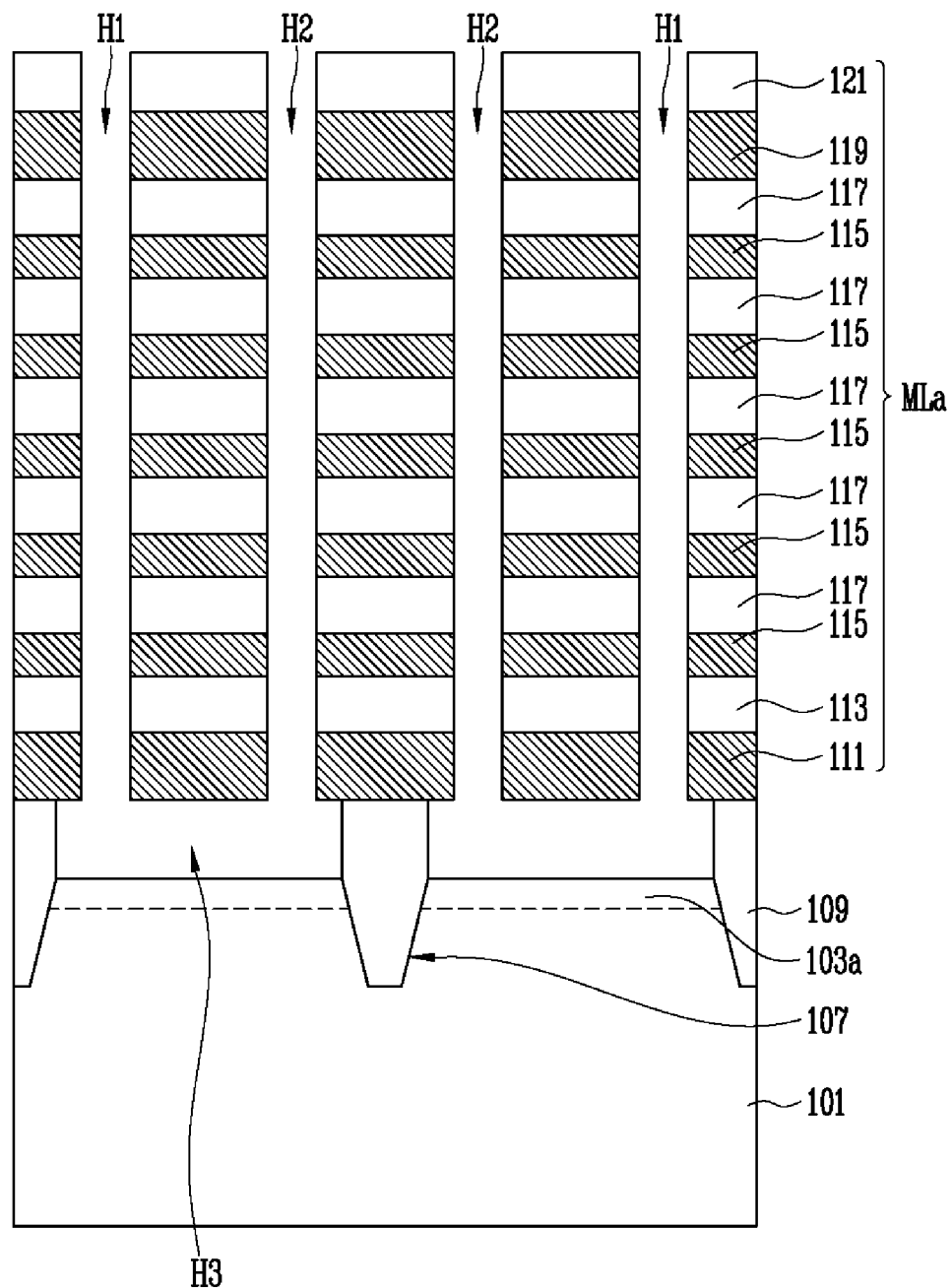

Referring to FIG. 6F, an etch material may be penetrated through the first and the second channel holes H1 and H2 in order to strip the sacrificial layer patterns 105a, thereby forming pipe channel holes H3 each coupling the pair of first and second channel holes H1 and H2. Thus, generally U-shaped channel holes, each including the first and the second channel holes H1 and H2 and the pipe channel hole H3, may be formed. The remaining second hard mask patterns may be removed after forming the generally U-shaped channel holes.

Figure 6G:
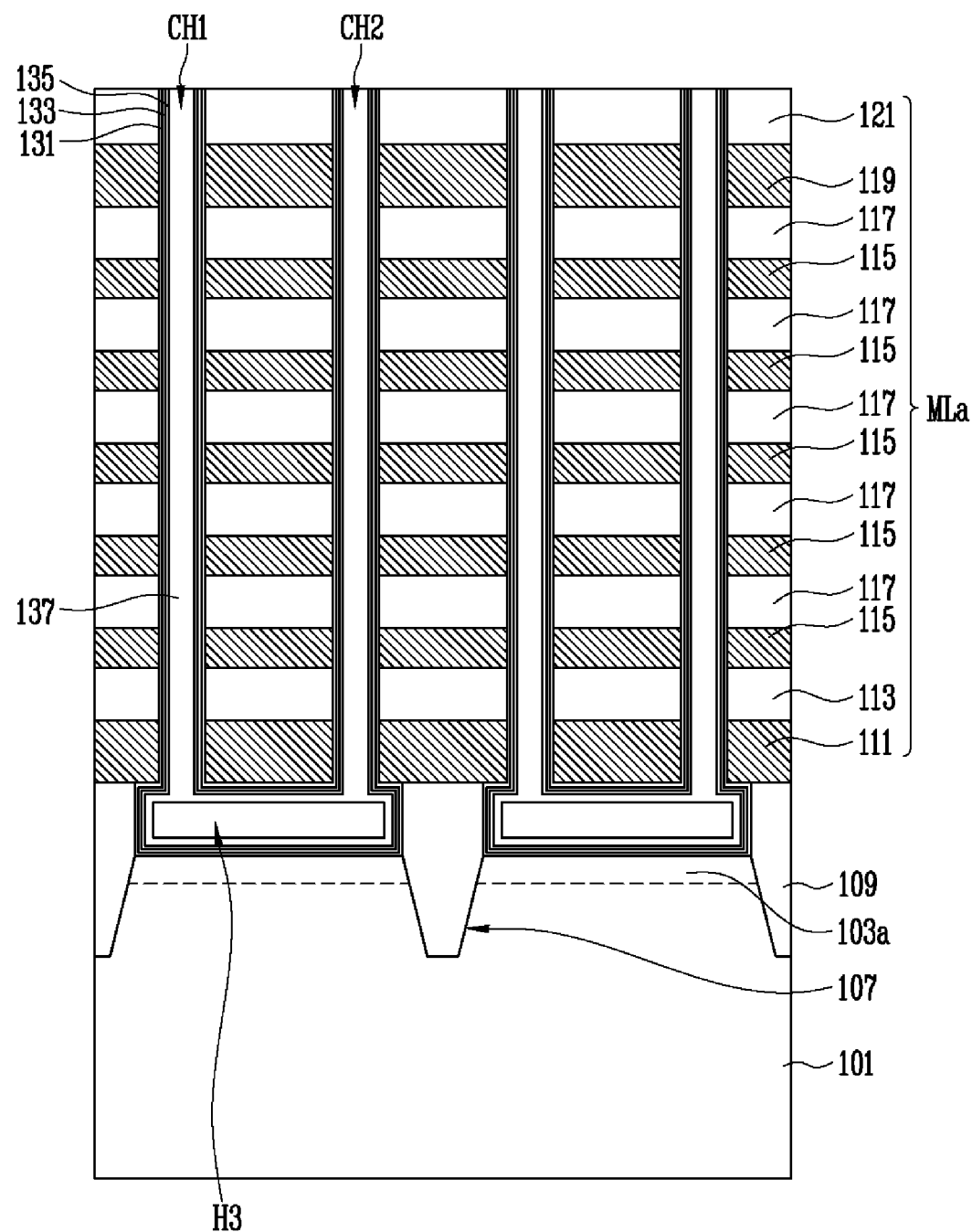

Referring to FIG. 6G, the first stack layer 131, the second stack layer 133, and the third stack layer 135 may be sequentially formed substantially on the inner wall of the first and the second channel holes H1 and H2 and the pipe channel hole H3. The stack layers including the first to third stack layers 131, 133, and 135 may be formed by sequentially stacking an oxide layer, a nitride layer, and an oxide layer or may be formed of thin dielectric layers of multiple layers having a high dielectric constant.

Next, a semiconductor layer 137 having sufficient thickness may be formed so that the first and the second channel holes H1 and H2 may be substantially filled. The semiconductor layer 137 may be an undoped polysilicon layer. A polishing process, such as CMP, may be performed so that the semiconductor layer 137 may remain only within the first and the second channel holes H1 and H2. Thus, pairs of the first and the second vertical channel layers CH1 and CH2 each may be configured to have an outer wall substantially surrounded by the stack layers 131, 133, and 135 and to penetrate the stack structure MLa may be formed. The first vertical channel layer CH1 may be formed substantially within the first channel hole H1, and the second vertical channel layer CH2 may be formed within the second channel hole H2. Meanwhile, the semiconductor layer 137 may be formed substantially on the inner walls of the pipe channel holes H3 without filling the pipe channel holes H3.

Figure 6H:
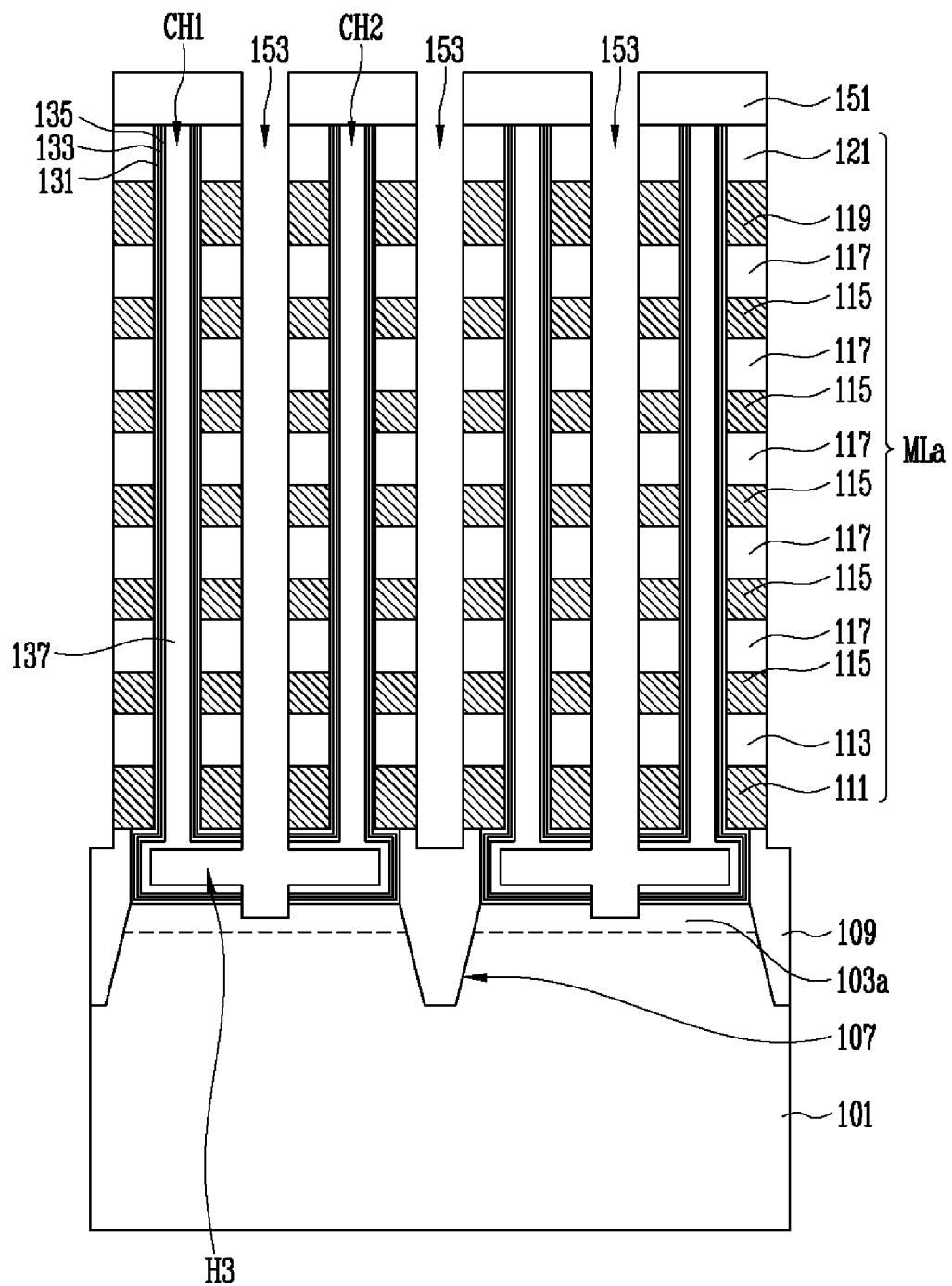

Referring to FIG. 6H, third hard mask patterns 151 may be formed substantially over the entire structure in which the first and the second vertical channel layers CH1 and CH2 may be formed through a photolithography process. The third hard mask patterns 151 may be formed of a nitride layer, and they function as an etch mask in an etch process for patterning the stack structure MLa into a plurality of line patterns. A region substantially between the first and the second vertical channel layers CH1 and CH2, a region substantially between the first vertical channel layers CH1 generally adjacent to each other, and a region substantially between the second vertical channel layers CH2 generally adjacent to each other may be substantially exposed through the third hard mask patterns 151 in generally a line form generally parallel to the Y direction.

The stack structure MLa, the stack layers 131, 133, and 135, and the semiconductor layer 137 may be etched by an etch process using the third hard mask patterns 151 as an etch mask, thereby forming a slit 153 substantially between the first and the second vertical channel layers CH1 and CH2. The slits 153 may be formed to substantially penetrate the stack structure MLa and the stack layers 131, 133, and 135 and may be extended down to the semiconductor substrate 101. Furthermore, each of some of the slits 153 may be formed substantially between the first vertical channel layers CH1 generally adjacent to each other and substantially between the second vertical channel layers CH2 generally adjacent to each other, formed to substantially penetrate the stack structure MLa, and generally extend down to the isolation layers 109. The first impurity regions 103a of the semiconductor substrate 101 may be exposed through the slits 153 generally extended down to the semiconductor substrate 101.

Figure 6I:
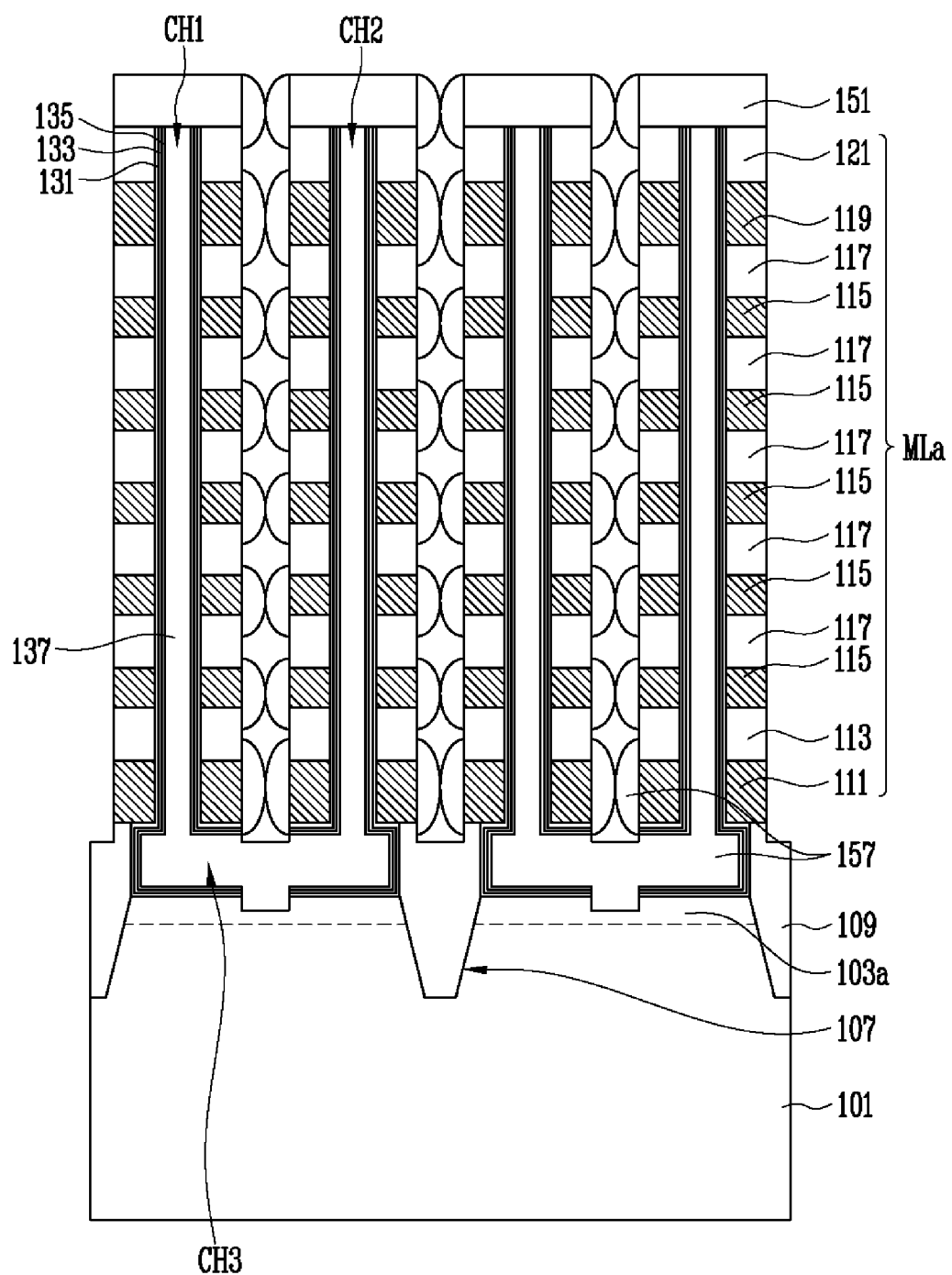

Referring to FIG. 6I, a polysilicon layer 157, that may be, a semiconductor layer may be grown using a Selective Epitaxial Growth (SEG) method so that the pipe channel holes H3 and a part of the slits 153 (hereinafter referred to as a 'the extension part of the slit 153') extended from the pipe channel holes H3 to the semiconductor substrate 101 may be substantially filled with the polysilicon layer 157. The polysilicon layer 157 may also be grown substantially on the sidewalls of the pipe gate layers 111, the cell gate layers 115, and the select gate layers 119, exposed through the slits 153 and formed of a polysilicon layer, by an SEG method.

Figure 6J:
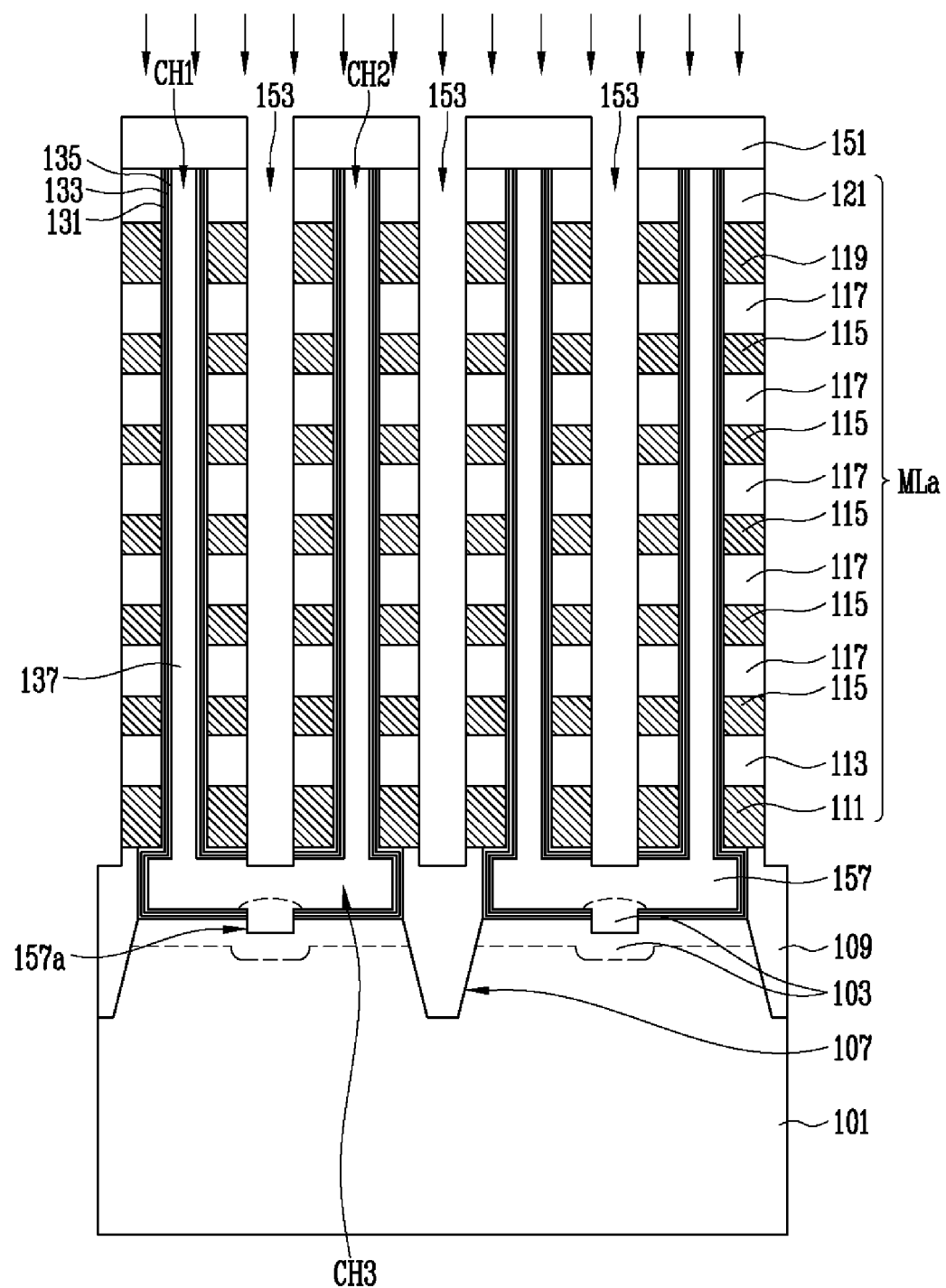

Referring to FIG. 6J, the polysilicon layer 157 formed substantially on the sidewalls of the pipe gate layers 111, the cell gate layers 115, and the select gate layers 119 may be removed by an etch process using the third hard mask patterns 151 as an etch mask. Thus, the polysilicon layer 157 may substantially remain only within the pipe channel holes H3 (i.e., see FIG. 6F) and the extension parts of the slits 153, so that the pipe channel layers CH3 each configured to couple the pair of first and second vertical channel layers CH1 and CH2 and channel layer extension parts 157a each generally extended from the pipe channel layer CH3 to the semiconductor substrate 101 may be formed. The generally U-shaped channel layers, each including the first and the second vertical channel layers CH1 and CH2 and the pipe channel layer CH3, may be coupled to the semiconductor substrate 101 through the respective channel layer extension parts 157a which substantially fill the extension parts of the slits 153 through which the semiconductor substrate 101 may be exposed.

After forming the generally U-shaped channel layers coupled to the semiconductor substrate 101 through the channel layer extension parts 157a, P-type impurities may be additionally implanted through the opening regions of the slits 153 in order to supplement the amount of the P-type impurities lost from the first impurity region 103a in the SEG process. Second impurity regions 103, that is, P-type impurity regions may be formed generally in a surface of the semiconductor substrate 101 by the additional implantation process of the P-type impurities. The second impurity regions 103 may also be formed in the channel layer extension parts 157a coupled to the semiconductor substrate 101. It may be preferred that the process of forming the second impurity regions 103 be performed by applying higher energy than the process of forming the first impurity region 103a (see FIG. 6I) so that the P-type impurities may be implanted into the channel layer extension parts 157a and the semiconductor substrate 101. It may be preferred that the second impurity regions 103 be formed by implanting the P-type impurities having a higher concentration than the P-type impurities implanted into the entire semiconductor substrate 101 so that holes may be smoothly supplied in an erase operation. For example, the second impurity regions 103 may be formed by implanting the P-type impurities having 1E12 atoms/cm$^2$ to 1E13 atoms/cm$^2$.

Figure 6K:
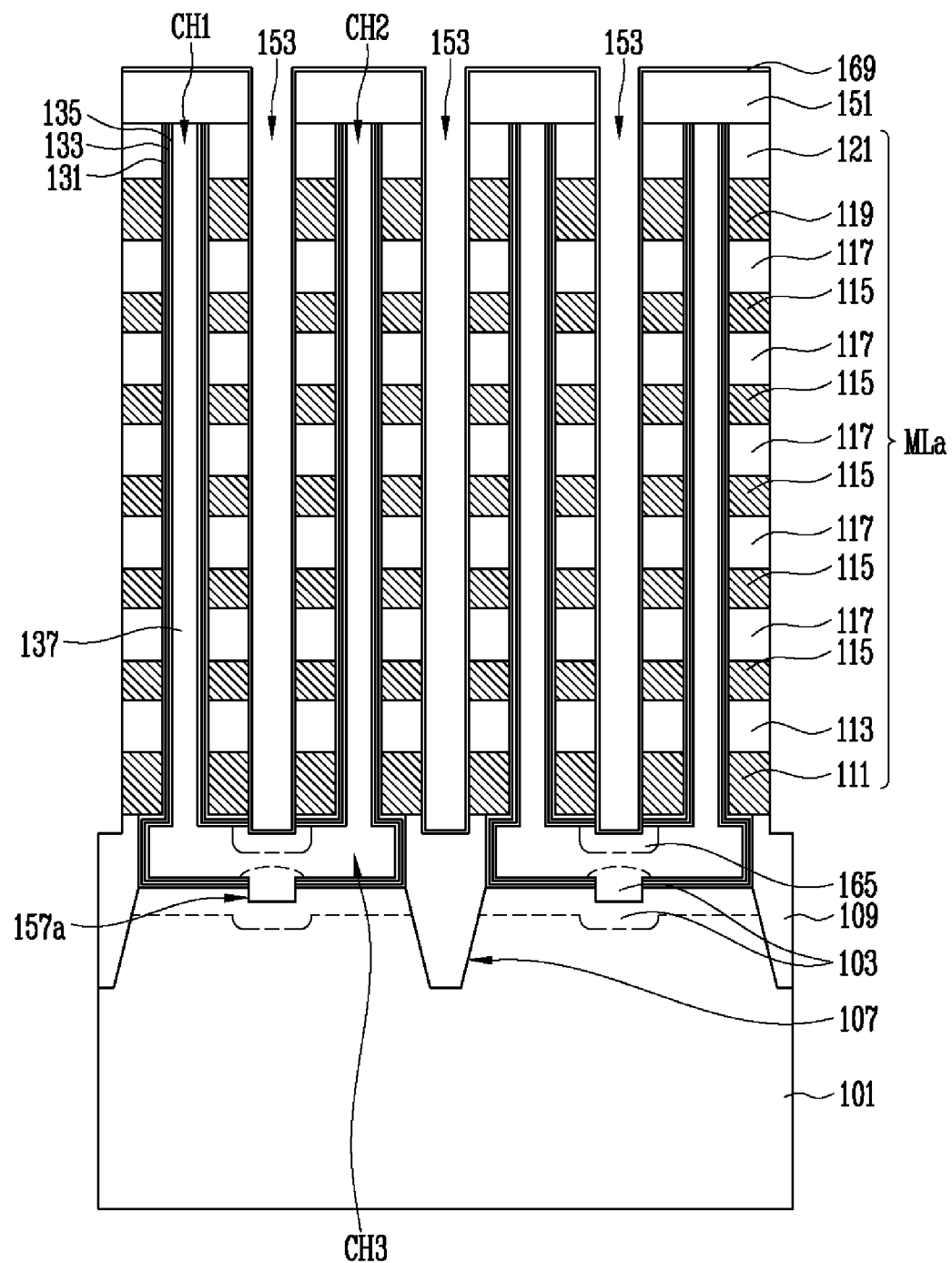

Referring to FIG. 6K, N-type impurities may be implanted through the opening regions of the slits 153, thereby forming third impurity regions 165, that is, N-type impurity regions each formed substantially in a surface of the pipe channel layer CH3 substantially between the first and the second vertical channel layers CH1 and CH2 which has been opened through the slit 153. It may be preferred that the process of forming the third impurity regions 165 be performed by implanting the N-type impurities using lower energy than the process of forming the second impurity regions 103. Each of the third impurity regions 165 may be formed to substantially surround a surface of a metal silicide layer 171 (see FIG. 4A) which may be formed in a part of the pipe channel layer CH3, opened through the slit 153, in a subsequent process. An area where the third impurity region 165 may be formed may be controlled by an implantation depth in the impurity implantation process or a thermal process for diffusing the N-type impurities.

The impurities implanted in order to form the second and the third impurity regions 103 and 165 may be activated or diffused by an additional thermal process or may be activated or diffused by subsequent heat.

Meanwhile, a silicidation process may be further performed in order to form a metal silicide layer for improving the RC (resistive-capacitive) delay of the word lines, the select lines, and the pipe gates of the non-volatile memory device formed of a polysilicon layer and for improving channel resistance. For the silicidation process, first, a metal layer 169 may be formed substantially on a surface of the slits 153 and a surface of the pipe channel layers CH3 substantially exposed through the slits 153. The metal layer 169 may be made of tungsten (W), nickel (Ni), or cobalt (Co), etc.

Figure 6L:
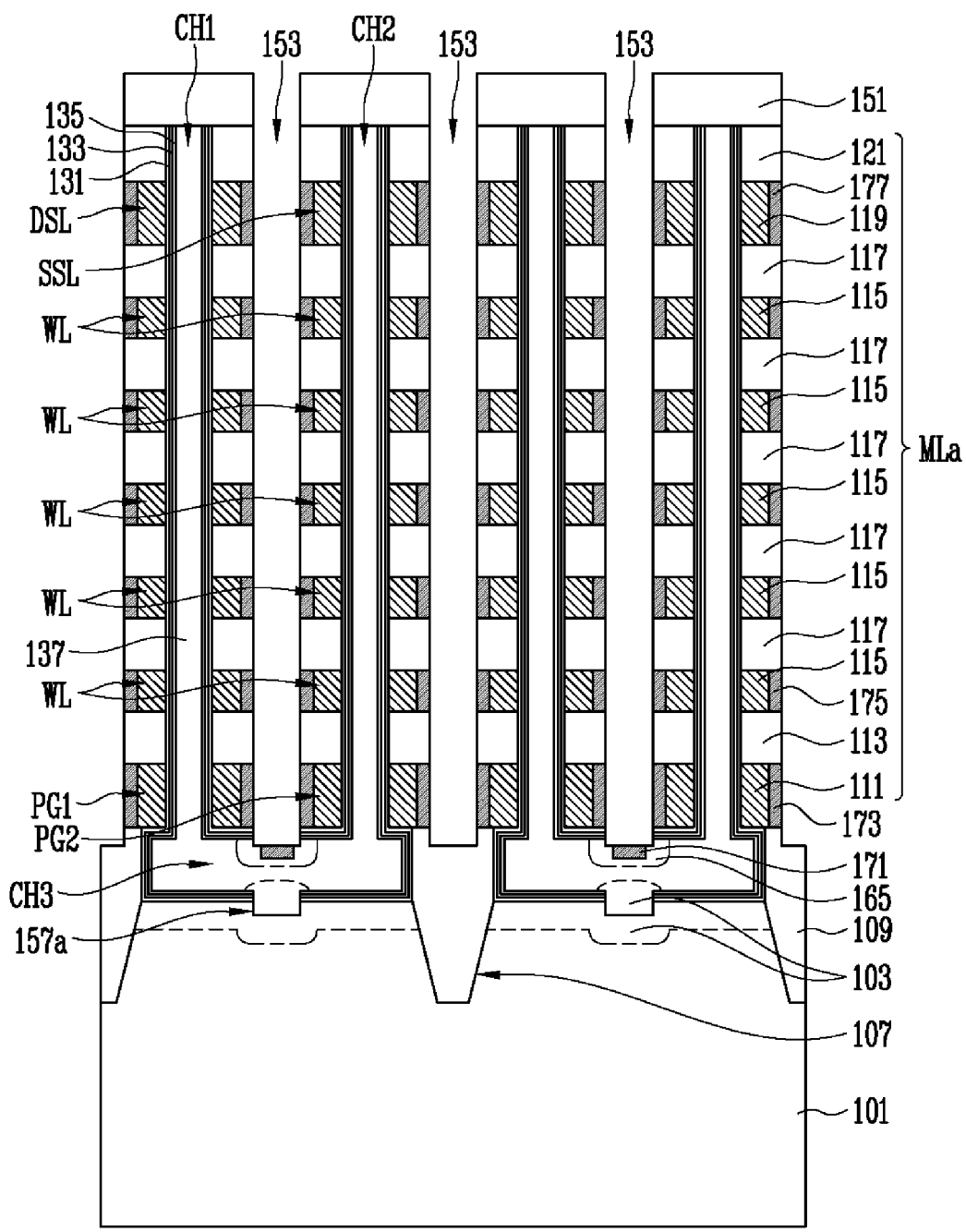

Referring to FIG. 6L, heat may be applied so that the metal silicide layers 171, 173, 175, and 177 are formed by the reaction of the metal layer 169 (see FIG. 6K) with the pipe channel layers CH3, the pipe gate layers 111, the cell gate layers 115, and the select gate layers 119 which may be polysilicon layers. Next, the metal layer 169 that remains without having a reaction may be removed. Thus, the source select line SSL and the drain select line DSL, each including the polysilicon layer 119 for a select gate and the metal silicide layer 177 formed to substantially surround the outer wall of the polysilicon layer 119, may be formed. Furthermore, the word lines WL, each formed of the polysilicon layer 115 for a cell gate and the metal silicide layer 175, may be formed. Furthermore, the first and the second pipe gates PG1 and PG2, formed of the polysilicon layer 111 for a pipe gate and the metal silicide layer 173 substantially surrounding the outer wall of the polysilicon layer 111, may be formed. Furthermore, the metal silicide layer 171 surrounded by the third impurity region 165 may be formed in a surface of the pipe channel layer CH3 substantially between the first and the second vertical channel layers CH1 and CH2 which have been substantially opened through the slit 153.

Figure 6M:
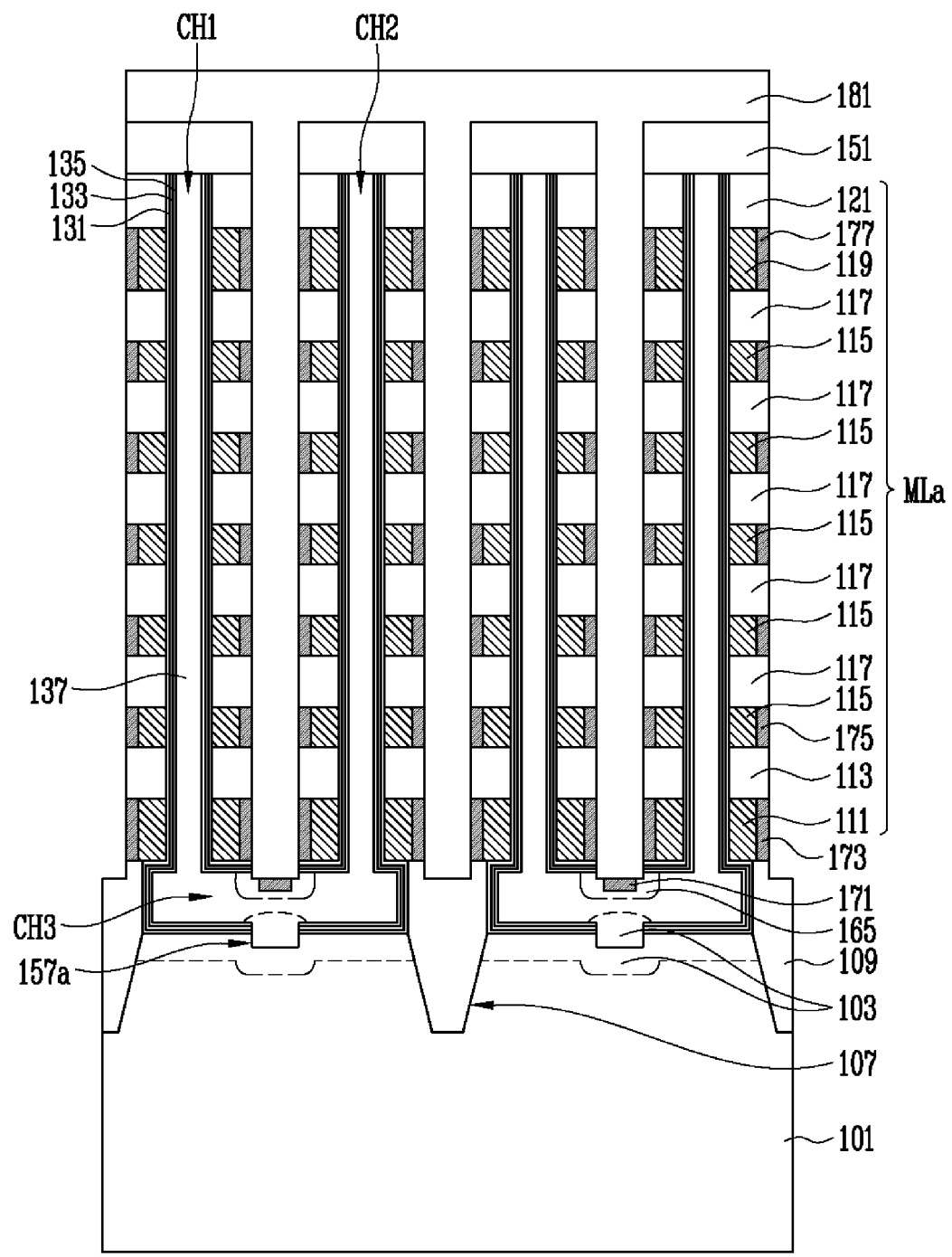

Referring to FIG. 6M, an interlayer insulating layer 181 may be formed to a thickness enough to substantially fill the slits 153 (see FIG. 6L). The interlayer insulating layer 181 may be substantially formed of an oxide layer.

Figure 6N:
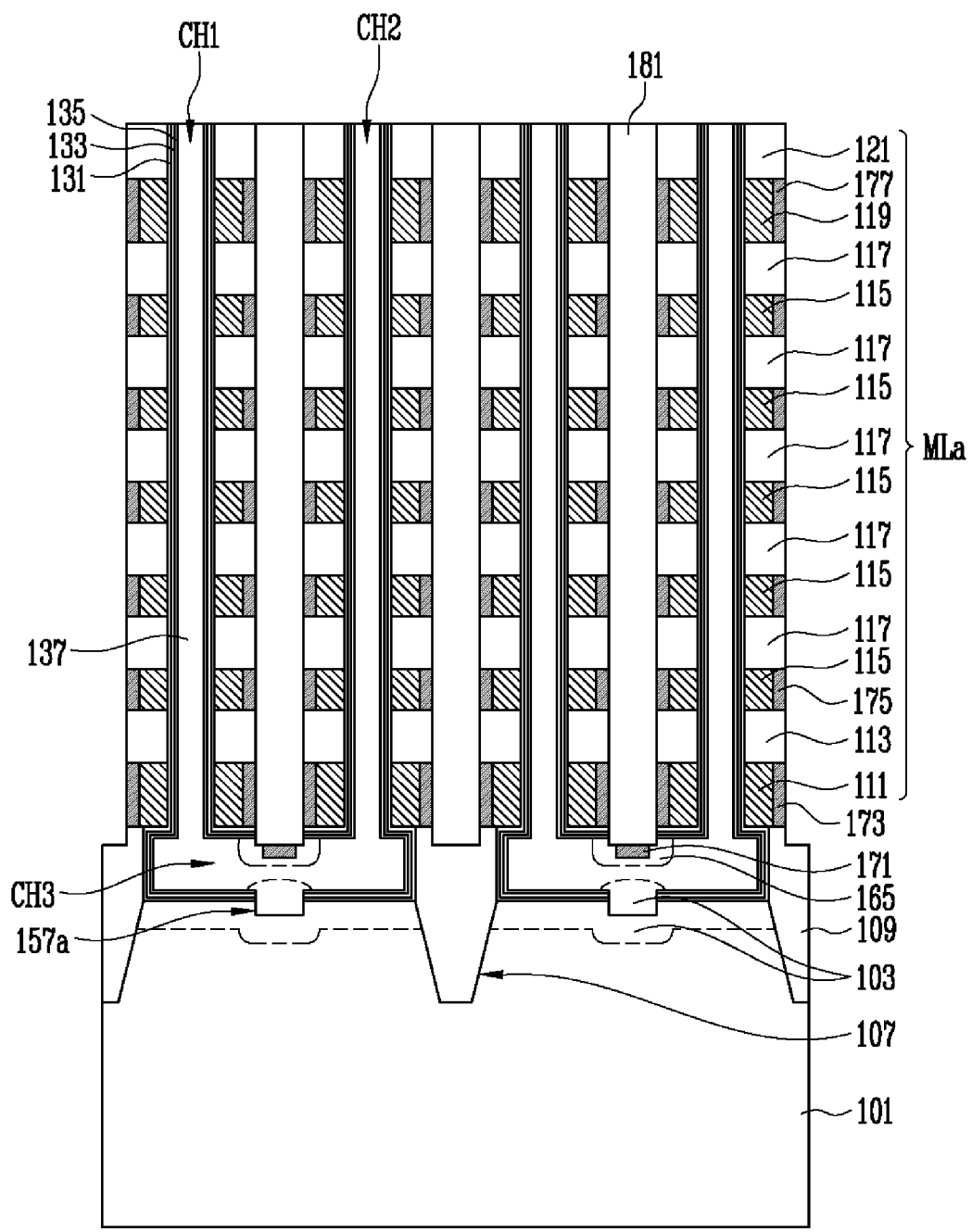
Figure 60:
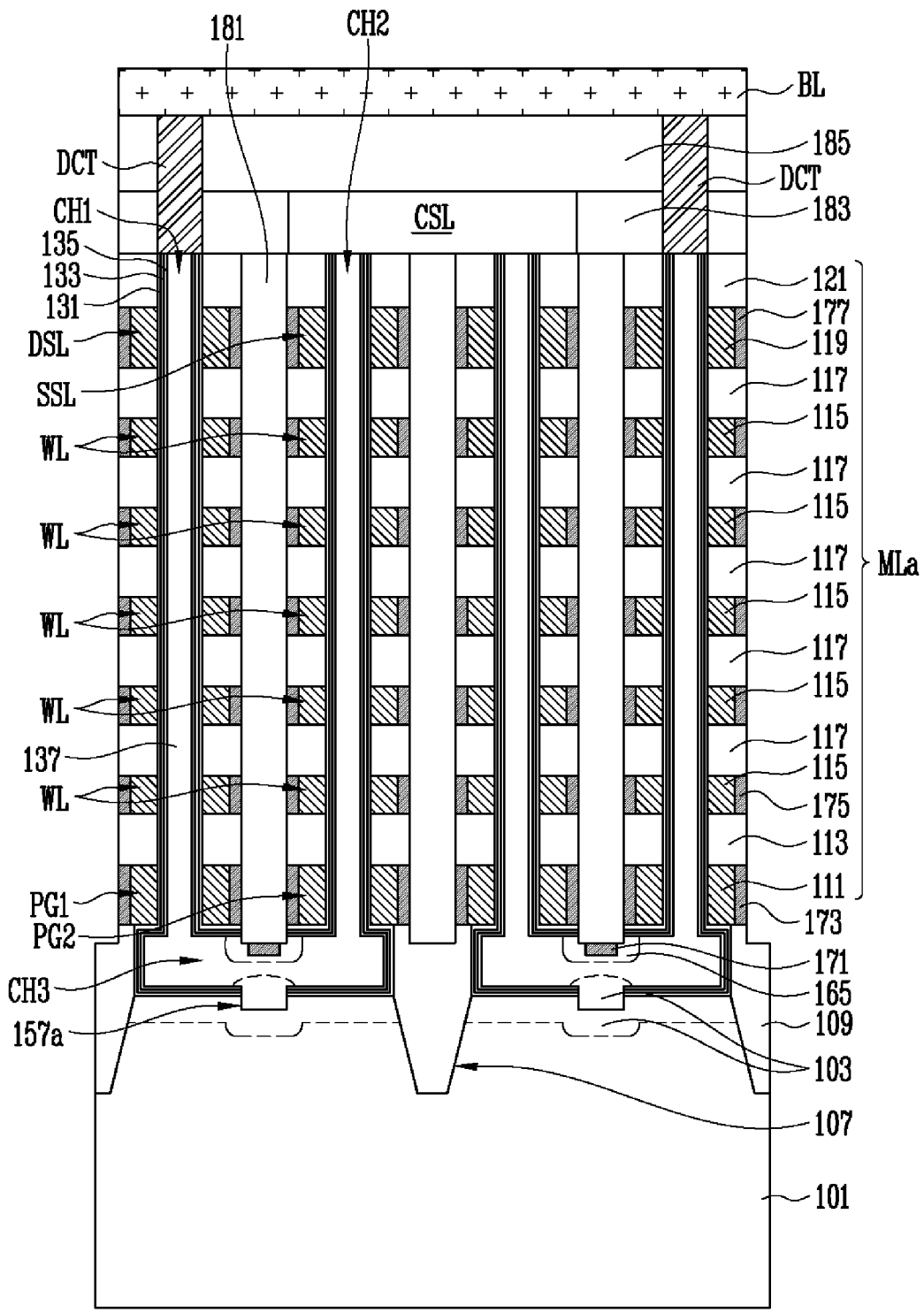

Referring to FIG. 6N, after polishing the interlayer insulating layer 181 so that the third hard mask patterns 151 (see FIG. 6M) may be exposed, the third hard mask patterns 151 may be removed by a strip process.

Referring to FIG. 6O, the common source lines CSL, each coupled to a pair of the second vertical channel layers CH3 generally adjacent to each other, are formed. After forming an interlayer insulating layer 183 insulating the common source lines CSL from each other, an interlayer insulating layer 185 substantially covering the common source lines CSL may be formed. Furthermore, the drain contact plugs DCT coupled to the first vertical channel layer CH1, respectively, through the interlayer insulating layers 185 and 183 may be formed. Next, the bit lines BL coupled to the drain contact plugs DCT may be formed.

FIGS. 7A to 7E are diagrams illustrating another example of a method of manufacturing the non-volatile memory device illustrated in FIG. 1.

Figure 7A:
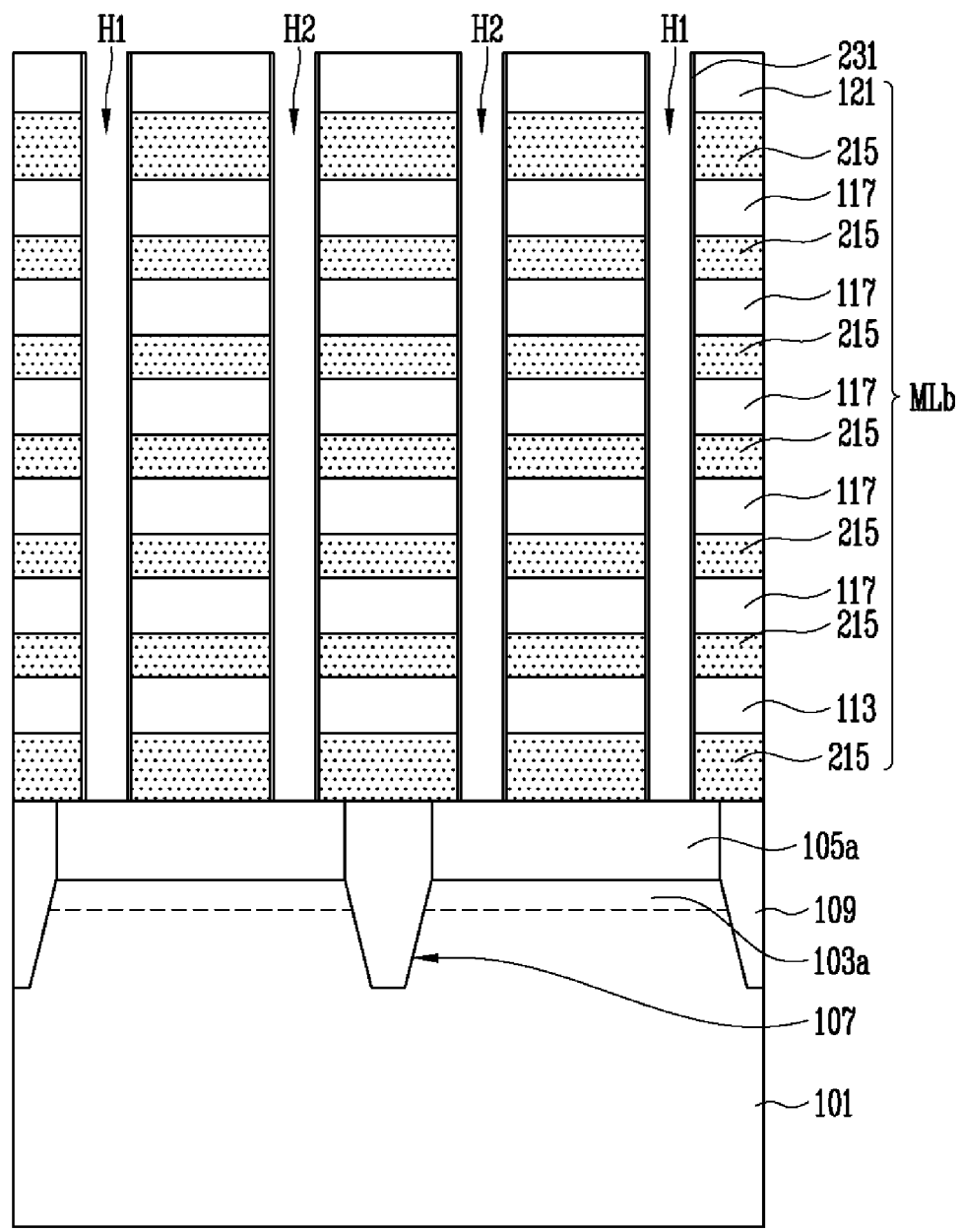
FIGS. 7A to 7E are diagrams illustrating another method of manufacturing the non-volatile memory device illustrated in FIG. 1.

Referring to FIG. 7A, a first impurity region 103a may be formed substantially on a surface of a P-type semiconductor substrate 101 made substantially of monocrystalline silicon, as described above with reference to FIG. 6A. The first impurity region 103a may function as a well pick-up and may function to improve the supplying of holes to the channel layer in an erase operation.

Next, sacrificial layer patterns 105a, trenches 107, and isolation layers 109 may be formed as described above with reference to FIGS. 6B to 6D.

A stack structure MLb may be formed by alternately stacking a plurality of first and second material layers substantially over the isolation layers 109 and the sacrificial layer patterns 105a. The first material layers may be sacrificial layers 215, and the second material layers may be a plurality of interlayer insulating layers 113, 117, and 121. The lowest layer of the plurality of interlayer insulating layers 113, 117, and 121 may be a pipe gate insulating layer 113. The number of each of the sacrificial layers and the interlayer insulating layers, of the stack structure MLb, may vary according to the number of memory cells to be stacked.

The plurality of interlayer insulating layers 113, 117, and 121 may be made substantially of oxide layers. It may be preferred that the plurality of sacrificial layers 215 be made of material having an etch selectivity to the plurality of interlayer insulating layers 113, 117, and 121. For example, if the plurality of interlayer insulating layers 113, 117, and 121 are oxide layers, the plurality of sacrificial layers 215 may be nitride layers.

A plurality of first channel holes H1 and a plurality of second channel holes H2 which penetrate the stack structure MLb may be formed by an etch process. The etch process for forming the first and the second channel holes H1 and H2 may be an etch process which may be stopped when the sacrificial layer patterns 105a are substantially exposed by using second hard mask patterns (not shown) as an etch mask after forming the second hard mask patterns over the interlayer insulating layers 121 using a photolithography process.

Pairs of vertical holes, each including the first and the second channel holes H1 and H2, may be formed substantially over the respective sacrificial layer patterns 105a separated from each other by the isolation layer 109. Furthermore, the first and the second channel holes H1 and H2 may be formed generally in parallel.

Next, a passivation layer 231 may be formed substantially on the sidewalls of the first and the second channel holes H1 and H2. It may be preferred that the passivation layer 231 be made of material having an etch selectivity to the sacrificial layer patterns 105a and the stack structure MLb. For example, if the sacrificial layer patterns 105a and the sacrificial layers 215 are formed of nitride layers and the plurality of interlayer insulating layers 113, 117, and 121 are formed of oxide layers, the passivation layer 231 may be formed of a TiN layer.

Figure 7B:
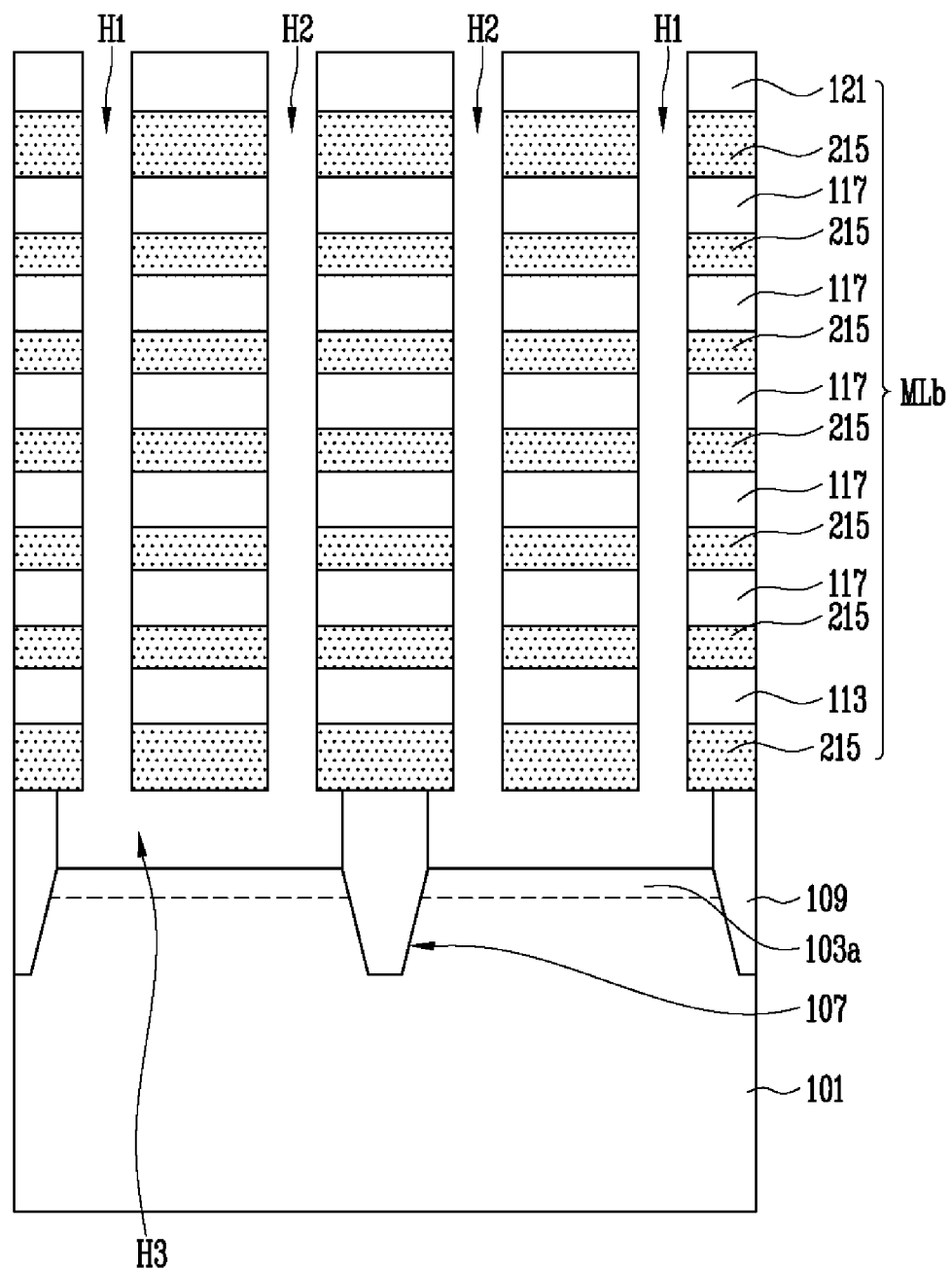

Referring to FIG. 7B, an etch material may be penetrated through the first and the second channel holes H1 and H2 in order to substantially strip the sacrificial layer patterns 105a, thereby forming pipe channel holes H3 each coupling the pair of first and second channel holes H1 and H2. Furthermore, the remaining second hard mask patterns and the remaining passivation layer 231 may be removed. Thus, generally U-shaped channel holes, each including the first and the second channel holes H1 and H2 and the pipe channel hole H3, may be formed.

Figure 7C:
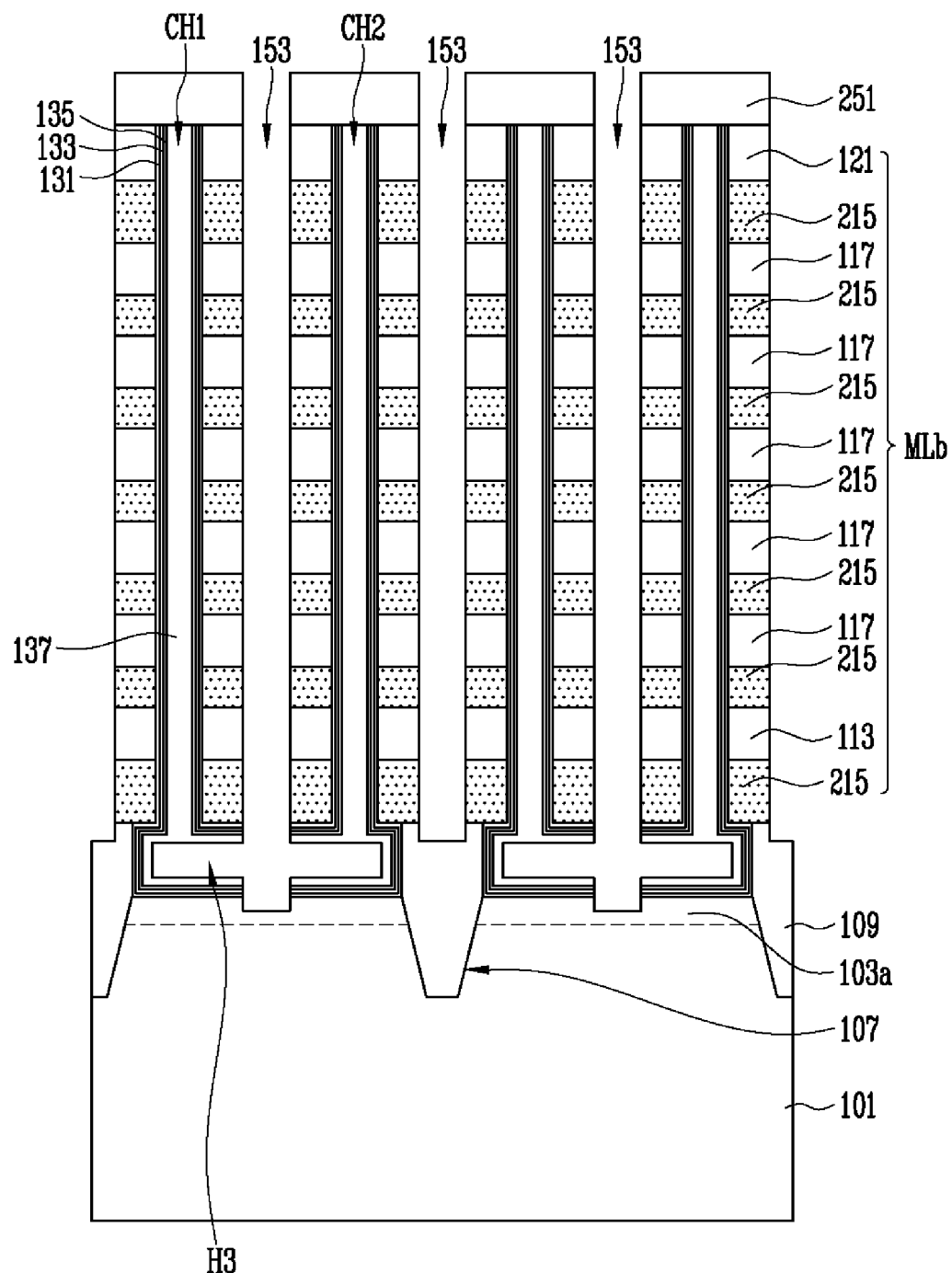

Referring to FIG. 7C, as described above with reference to FIG. 6G, stack layers 131, 133, and 135 may be formed substantially on the inner walls of the first and the second channel holes H1 and H2 and the pipe channel holes H3, and a semiconductor layer 137 substantially filling the inside of the first and the second channel holes H1 and H2 may be formed, thereby forming first vertical channel layers CH1 and second vertical channel layers CH2.

Third hard mask patterns 251 may be formed substantially over the entire structure in which the first and the second vertical channel layers CH1 and CH2 may be formed, by a photolithography process. It may be preferred that the third hard mask patterns 251 be made of material having an etch selectivity to the stack structure MLb. Furthermore, the third hard mask patterns 251 may function as an etch mask in an etch process for patterning the stack structure MLb into a plurality of line patterns. A region substantially between the first and the second vertical channel layers CH1 and CH2, a region substantially between the first vertical channel layers CH1 generally adjacent to each other, and a region substantially between the second vertical channel layers CH2 generally adjacent to each other may be substantially exposed through the third hard mask patterns 251 generally in a line form generally parallel to the Y direction.

The stack structure MLb, the stack layers 131, 133, and 135, and the semiconductor layer 137 may be etched by an etch process using the third hard mask patterns 251 as an etch mask, thereby forming a slit 153 substantially between the first and the second vertical channel layers CH1 and CH2. The slits 153 may be formed to substantially penetrate the stack structure MLb, the stack layers 131, 133, and 135, and the semiconductor layer 137 and may be extended substantially down to the semiconductor substrate 101. Furthermore, a slit 153 formed to penetrate the stack structure MLb and generally extended down to the isolation layers 109 may be formed substantially between the first vertical channel layers CH1 generally adjacent to each other and substantially between the second vertical channel layers CH2 generally adjacent to each other. The semiconductor substrate 101, in particular, the first impurity region 103a of the semiconductor substrate 101 may be substantially exposed through the slits 153 generally extending down to the semiconductor substrate 101.

Figure 7D:
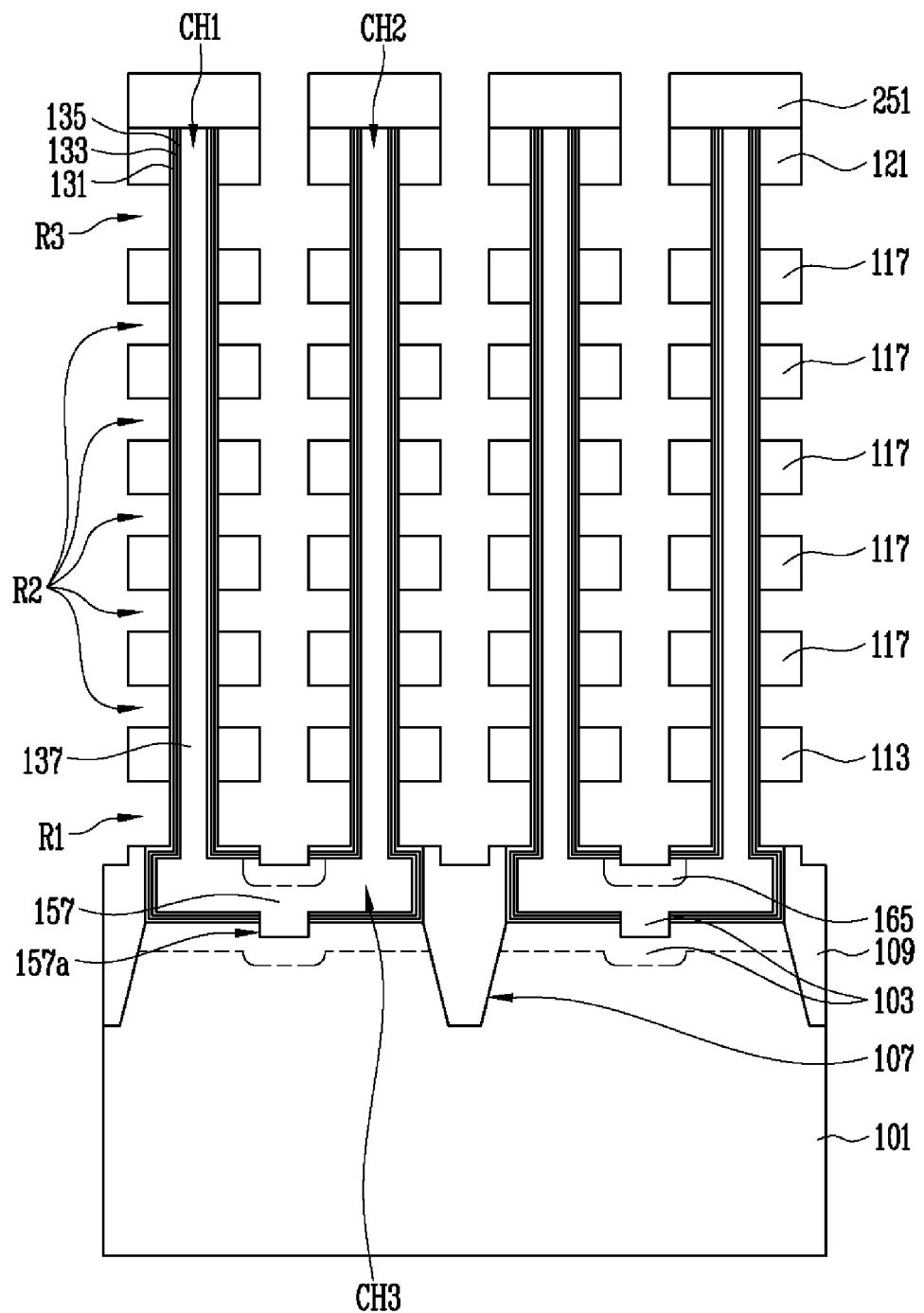

Referring to FIG. 7D, a polysilicon layer 157, that is, a semiconductor layer may be grown by an SEG method, so that the pipe channel holes H3 and the extension parts of the slits 153 (see FIG. 7C) are substantially filled with the polysilicon layer 157. Thus, the polysilicon layer 157 may remain substantially within the pipe channel holes H3 and the extension parts of the slits 153. Accordingly, pipe channel layers CH3, each coupling a pair of the first and second vertical channel layers CH1 and CH2, and channel layer extension parts 157a, each generally extended from the pipe channel layer CH3 to the semiconductor substrate 101, may be formed. The generally U-shaped channel layers, each including the first and the second vertical channel layers CH1 and CH2 and the pipe channel layer CH3, may be coupled to the semiconductor substrate 101 through the respective channel layer extension parts 157a substantially filling the extension parts of the slits 153 through which the semiconductor substrate 101 may be substantially exposed.

After forming the generally U-shaped channel layers coupled to the semiconductor substrate 101 through the channel layer extension parts 157a, second impurity regions 103, that is, P-type impurity regions may be formed in a surface of the semiconductor substrate 101 by additionally implanting P-type impurities through the opening regions of the slits 153, as described above with reference to FIG. 6J. The second impurity regions 103 may also be formed substantially within the channel layer extension parts 157a coupled to the semiconductor substrate 101.

Furthermore, as descried above with reference to FIG. 6K, N-type impurities may be implanted through the opening regions of the slits 153, thereby forming third impurity regions 165, that is, N-type impurity regions each formed in a surface of the pipe channel layer CH3 substantially between the first and the second vertical channel layers CH1 and CH2 which have been opened through the slit 153.

Next, recess regions R1, R2, and R3 may be formed by substantially removing the plurality of sacrificial layers 215 generally exposed through the slits 153.

Figure 7E:
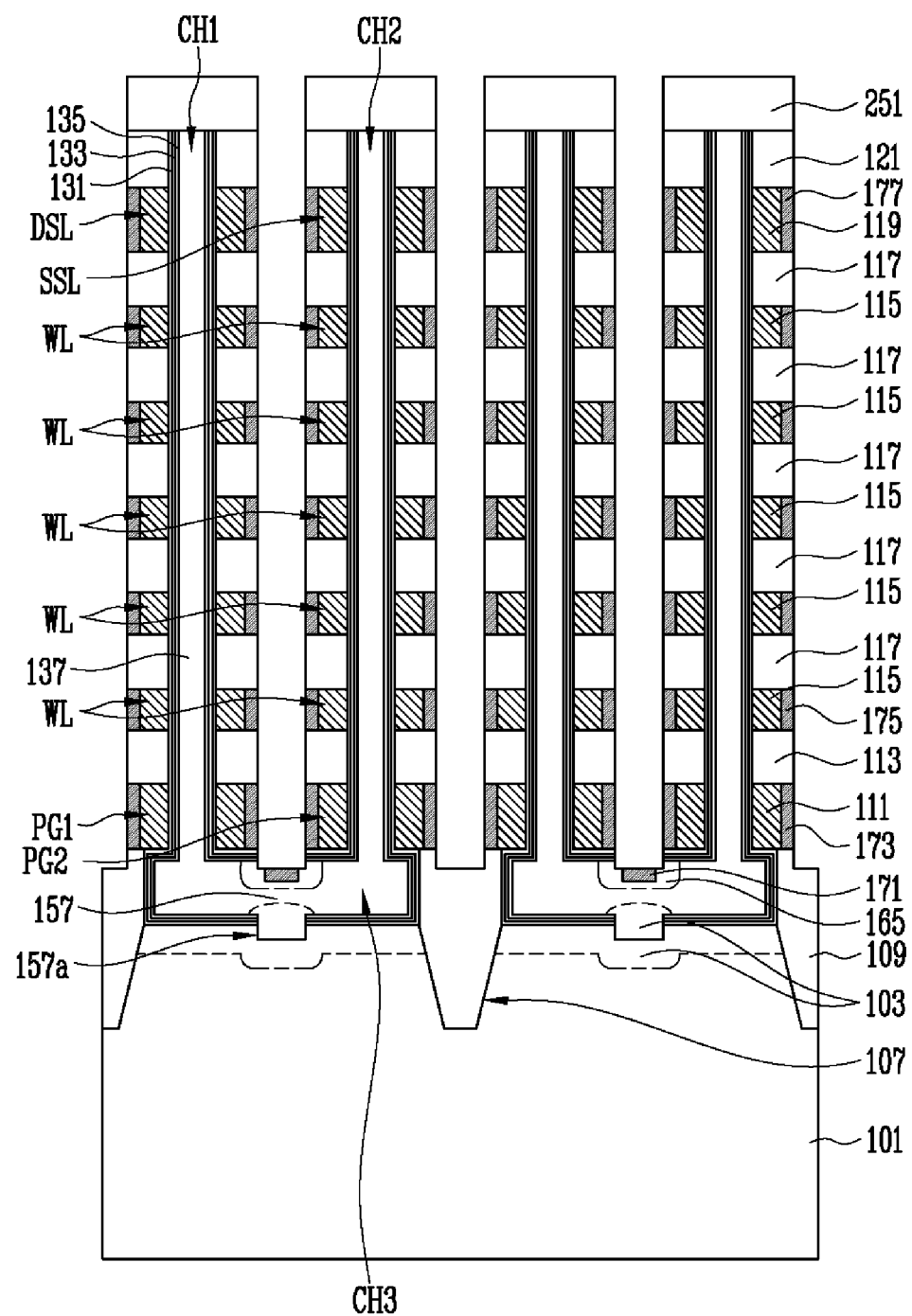

Referring to FIGS. 7E and 7D, pipe gate layers 111 may be formed in the recess region R1 of the lowest layer, select gate layers 119 may be formed in the recess region R3 of the highest layer, and cell gate layers 115 may be formed in the respective recess region R2 each substantially between the recess region R1 of the lowest layer and the recess region R3 of the highest layer by substantially filling the recess regions R1, R2, and R3 with a conductive layer. The conductive layer may be a metal layer or a polysilicon layer, etc.

Next, metal silicide layers 171, 173, 175, and 177 may be formed by a silicidation process. If the conductive layer formed to substantially fill the recess regions R1, R2, and R3 is a polysilicon layer, the sidewalls of the pipe gate layers 111, the cell gate layers 115, and the select gate layers 119 may be silicided to a specific thickness by the silicidation process.

After forming the word lines WL, the drain and source select lines DSL and SSL, and the first and the second pipe gates PG1 and PG2 as in the previous embodiment, the interlayer insulating layer 181, the common source lines CSL, the interlayer insulating layers 183 and 185, the drain contact plugs DCT, and the bit lines BL may be formed by subsequent processes, as descried above with reference to FIGS. 6M and 6O.

Figure 8:
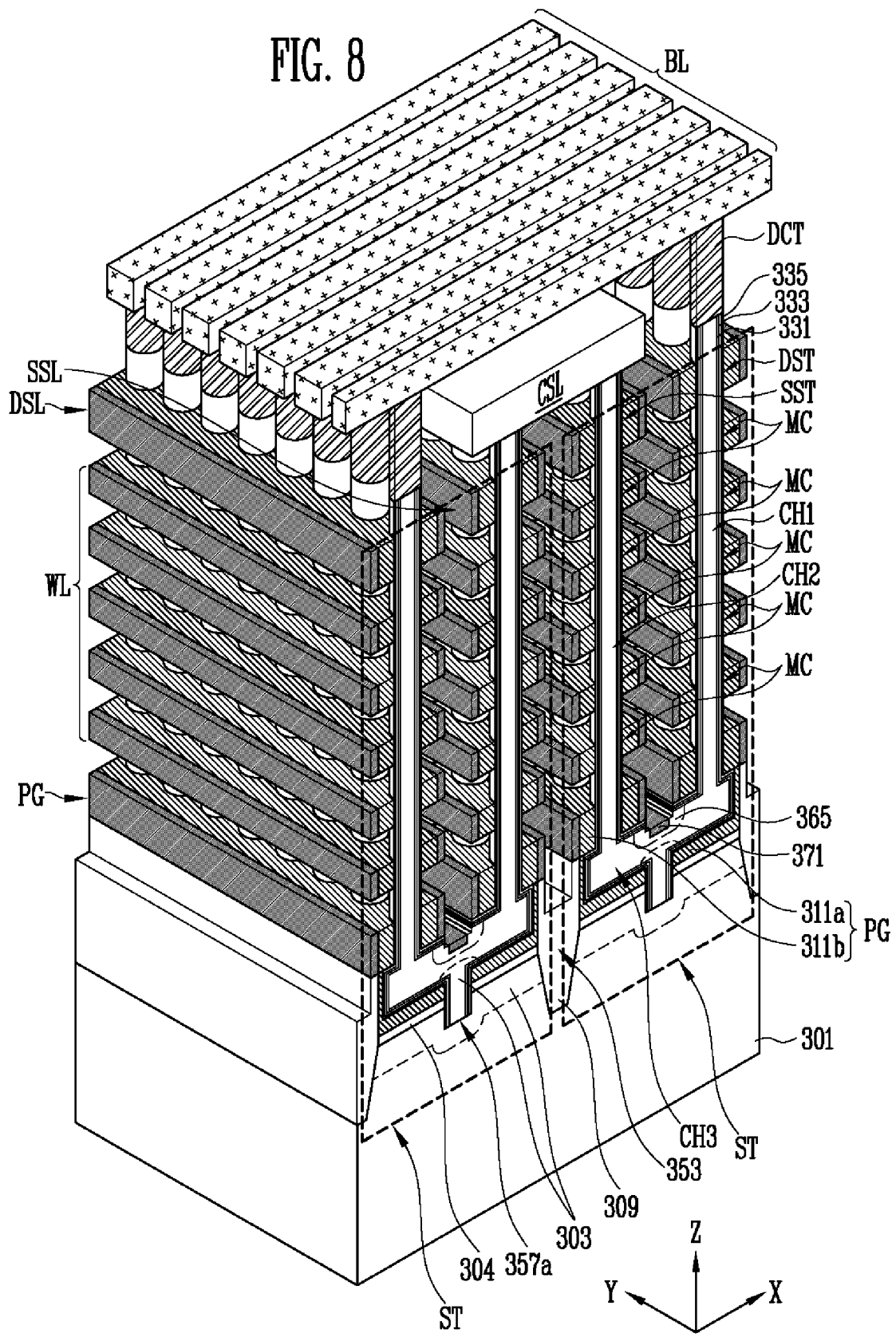
FIG. 8 is a diagram illustrating a non-volatile memory device according to a second embodiment of this disclosure.

FIG. 8 is a diagram illustrating a non-volatile memory device according to a second embodiment of this disclosure.

Referring to FIG. 8, the non-volatile memory device according to the second embodiment may include a plurality of memory string ST arranged substantially in a matrix form including a plurality of columns and a plurality of rows. Each of the memory strings ST may include a generally U-shaped channel layer and a channel layer extension part 357a generally extended from the generally U-shaped channel layer to the semiconductor substrate 301. The generally U-shaped channel layer may include first and second vertical channel layers CH1 and CH2 and a pipe channel layer CH3 formed to couple the first and the second vertical channel layers CH1 and CH2. The first and the second vertical channel layers CH1 and CH2 may upwardly protruded from the semiconductor substrate 301, formed generally in parallel in the Z direction, and spaced apart from each other. The pipe channel layer CH3 may be coupled to the semiconductor substrate 301 through the channel layer extension part 357a.

Furthermore, the memory string ST according to the second embodiment of this disclosure may include a drain select transistor DST formed substantially at the top of the first vertical channel layer CH1, a source select transistor SST formed substantially at the top of the second vertical channel layer CH2, a first memory cell group formed to include a plurality of memory cells MC stacked generally in a row along the first vertical channel layer CH1 substantially between the semiconductor substrate 301 and the drain select transistor DST, a second memory cell group formed to include a plurality of memory cells MC stacked in a row along the second vertical channel layer CH2 substantially between the semiconductor substrate 301 and the source select transistor SST, and a pipe transistor formed substantially between the first and the second memory cell groups.

The gate of the drain select transistor DST may be formed to substantially surround the outer wall of the first vertical channel layer CH1 and may be coupled to the drain select line DSL generally extending in the Y direction. A plurality of the drain select transistors DST of the plurality of memory strings ST may be arranged in a row generally in the Y direction may be coupled in common to the drain select line DSL. Furthermore, the gate of the drain select transistor DST may be formed to substantially surround the first vertical channel layer CH1 in the state in which stack layers 331, 333, and 335 formed to function as gate insulating layers and to substantially surround the outer wall of the first vertical channel layer CH1 may be interposed substantially between the gate of the drain select transistor DST and the first vertical channel layer CH1.

The gate of the source select transistor SST may be formed to substantially surround the outer wall of the second vertical channel layer CH2 and may be coupled to a source select line SSL generally extending in the Y direction. A plurality of the source select transistors SST of the plurality of memory strings ST generally arranged in a row in the Y direction may be coupled in common to the source select line SSL. Furthermore, the gate of the source select transistor SST may be formed to substantially surround the second vertical channel layer CH2 in the state in which the stack layers 331, 333, and 335 formed to function as gate insulating layers and to substantially surround the outer wall of the second vertical channel layer CH2 may be interposed substantially between the gate of the source select transistor SST and the second vertical channel layer CH2.

The gate of the memory cell MC may be formed to substantially surround the outer wall of the first or second vertical channel layer CH1 or CH2 and may be coupled to each of word lines WL generally extending in the Y direction.

The plurality of memory cells MC of the plurality of memory strings ST arranged generally in a row in the Y direction may be coupled in common to the word lines WL. Furthermore, the gates of the memory cells MC may be formed to substantially surround the first or second vertical channel layer CH1 or CH2 in the state in which the stack layers 331, 333, and 335 used as memory layers may be interposed substantially between the gates of the memory cells MC and the first or second vertical channel layer CH1 or CH2.

A pipe transistor may include the pipe channel layer CH3. The pipe gate PG of the pipe transistor may have a stack structure of a first pipe gate layer 311a and a second pipe gate layer 311b. The first pipe gate layer 311a may be formed to substantially surround the sidewall and bottom of the pipe channel layer CH3 and may be extended generally in the Y direction. The second pipe gate layer 311b may be formed substantially over the pipe channel layer CH3 and the first pipe gate layer 311a and may be extended generally in the Y direction. Furthermore, the second pipe gate layer 311b may have the same structure as the pipe gates PG1 and PG2 illustrated in FIG. 1. The plurality of memory strings ST generally arranged in a row in the Y direction may be coupled in common to each of the pipe gates PG. Furthermore, the pipe gate PG may be formed to substantially surround the pipe channel layer CH3 in the state in which the stack layers 331, 333, and 335 formed to function as gate insulating layers and to substantially surround the outer wall of the pipe channel layer CH3 are interposed substantially between the pipe gate PG and the pipe channel layer CH3.

The pipe gate PG and the semiconductor substrate 301 may be insolated from each other by a substrate insulating layer 304.

A slit 353 may be formed substantially between the drain select line DSL and the source select line SSL and substantially between a first gate group, including the word lines WL formed to substantially surround the first vertical channel layer CH1, and a second gate group, including the word lines WL formed to substantially surround the second vertical channel layer CH2. The slits 353 are formed generally in the Y direction, formed to substantially penetrate the pipe gates PG and the substrate insulating layer 304, and generally extend down to the semiconductor substrate 301. Furthermore, the slit 353 may be formed generally in the Y direction substantially between the memory strings ST generally adjacent to each other generally in the X direction so that the memory strings ST generally adjacent to each other in the X direction are separated from each other. The stack layers 331, 333, and 335 may be extended from a surface of each of the pipe channel layers CH3 to the sidewall of each of the channel layer extension parts 357a.

The memory strings ST which may be separated from each other with the slit 353 interposed therebetween and generally adjacent to each other, are generally symmetrically disposed on the basis of the slit 353. Accordingly, the second vertical channel layers CH2 of the memory strings ST generally adjacent to each other in the X direction may be disposed to be generally adjacent to each other, and the first vertical channel layer CH1 of the memory strings ST generally adjacent to each other in the X direction may be disposed to be generally adjacent to each other. The second vertical channel layers CH2 forming two columns generally adjacent to each other may be coupled in common to a common source line CSL which may be spaced apart from the source select line SSL over the source select line SSL. The common source line CSL may be extended generally in the Y direction.

The first vertical channel layer CH1 may be coupled to a drain contact plug DCT formed substantially over the first vertical channel layer CH1. The drain contact plug DCT may be coupled to a bit line BL which may be formed substantially over the drain contact plug DCT and formed generally in the X direction.

Although (not shown), an interlayer insulating layer may be formed substantially between the bit line BL and the common source line CSL, substantially between the source select line SSL and the common source line CSL, substantially between the word line WL and the source select line SSL, substantially between the drain select line DSL and the bit line BL, and substantially between the word lines WL stacked so that they are generally adjacent to each other. Furthermore, a pipe gate insulating layer may be formed substantially between the first gate group and the pipe gate PG and substantially between the second gate group and the pipe gate PG.

The drain contact plug DCT may be formed to penetrate the interlayer insulating layer substantially between the bit line BL and the drain select line DSL. The first vertical channel layer CH1 may be formed to penetrate the interlayer insulating layers substantially between the drain contact plug DCT and the pipe channel layer CH3 and conductive layers for the first gate group. The second vertical channel layer CH2 may be formed to penetrate the interlayer insulating layers substantially between the common source line CSL and the pipe channel layer CH3 and conductive layers for the second gate group.

The first and the second vertical channel layers CH1 and CH2 and the pipe channel layer CH3 may be formed of undoped polysilicon layers. The bit lines BL, the drain contact plugs DCT, and the common source line CSL may be made of metal. The drain select line DSL, the source select line SSL, the word lines WL, and the second pipe gate layers 311b may be formed of metal layers, or each of them may have a dual layer structure including a polysilicon layer and a metal silicide layer formed substantially on the sidewall of the polysilicon layer. Furthermore, the stack layers 331, 333, and 335 include a first stack layer 331 which may function as the blocking insulating layer of the memory cell MC, a second stack layer 333 which may function as the charge trap layer of the memory cell MC, and a third stack layer 335 which may function as the tunnel insulating layer of the memory cell MC. The third stack layer 335 may be formed substantially on the outer wall of the generally U-shaped channel layer, the second stack layer 333 may be formed generally on the outer wall of the third stack layer 335, and the first stack layer 331 may be formed generally on the outer wall of the second stack layer 333. Each of the first stack layer 331 and the third stack layer 335 may be formed of an oxide layer, and the second stack layer 333 may be formed of a nitride layer.

Each of the channel layer extension parts 357a may be formed to substantially fill a part of the slit 353 generally extending toward the semiconductor substrate 301 and may be extended from the pipe channel layer CH3 to the semiconductor substrate 301. The channel layer extension parts 357a may couple the pipe channel layer CH3 and the semiconductor substrate 301. The channel layer extension part 357a may be coupled to a P-type impurity region 303 formed in a surface of the semiconductor substrate 301. Meanwhile, the P-type impurity region 303 may also be formed substantially within the channel layer extension part 357a adjoining the semiconductor substrate 301.

The semiconductor substrate 301 according to this disclosure may be a P type semiconductor substrate into which P-type impurities have been implanted. Furthermore, the P-type impurity region 303 may be a region into which P-type impurities having a higher concentration than the P-type impurities implanted into the entire semiconductor substrate 301 have been implanted. The P-type impurity region 303 may be different from a well structure which may be formed by implanting P-type or N-type impurities into a specific depth of the semiconductor substrate 301 for isolation. The P-type impurities of $1E12$ atoms/cm$^2$ to $1E13$ atoms/cm$^2$ may be implanted into the P-type impurity region 303 in order to smoothly supply holes in an erase operation.

As described above, in the non-volatile memory device according to the second embodiment, the channel layers may be coupled to the semiconductor substrate 301, and thus holes can be supplied to the channel layers in an erase operation. Accordingly, Gate Induced Drain Leakage (GIDL) does not need to be induced on the select gate side so that holes are supplied to the channel layers in the erase operation. Furthermore, in the non-volatile memory device according to the second embodiment, the channel layers and the semiconductor substrate 301 may be coupled by the slits without occupying an additional space. Thus, the channel layers and the semiconductor substrate 301 may be coupled without increasing the size of the non-volatile memory device. Meanwhile, the P-type impurity regions 303 formed in the semiconductor substrate 301 may be used as well pick-up regions.

In the non-volatile memory device according to the second embodiment of this disclosure, a metal silicide layer 371 may be formed substantially over the pipe channel layer CH3 by siliciding a top surface of the pipe channel layer CH3 generally exposed through the slit 353 substantially between the first and the second gate groups. Accordingly, resistance of the pipe channel layer CH3 may be improved.

Furthermore, an N-type impurity region 365 may be formed over the channel layer extension part 357a by implanting impurities generally into a surface of the pipe channel layer CH3 generally exposed through the slit 353 substantially between the first and the second gate groups. If both the N-type impurity region 365 and the metal silicide layer 371 are formed in the pipe channel layer CH3, it may be more preferable that the N-type impurity region 365 be formed to substantially surround the surroundings of the metal silicide layer 371 so that the semiconductor substrate 301 and the N-type impurity region 365 form a PN diode. Thus, resistance of the pipe channel layer CH3 may be improved by the N-type impurity region 365.

The N-type impurity region 365 or the metal silicide layer 371 according to the second embodiment couples a channel which may be formed in a surface of the pipe channel layer CH3 generally adjacent to the pipe gate PG and a channel which may be formed generally in a surface of the pipe channel layer CH3 generally adjacent to the pipe gate PG, when the memory string ST may be operated. In the present embodiment, since the channels may be coupled generally on the top surface of the pipe channel layer CH3 as described above, channel resistance can be improved as compared with the case where channels are formed on the sidewalls and bottom of the pipe channel layer CH3.

In the present embodiment, since channel resistance is improved as described above, the first vertical channel layer CH1 and the second vertical channel layer CH2 do not need to be closely formed in order to secure channel resistance. Thus, a wide interval can be secured between the first memory cell group and the second memory cell group. Accordingly, the present disclosure can improve interference occurring substantially between the first memory cell group and the second memory cell group.

In the non-volatile memory device according to the second embodiment, an isolation layer 309 may be formed generally at each of the boundaries of the memory strings ST in order to improve insulation between the memory strings ST, as described above with reference to FIGS. 1 and 2.

The non-volatile memory device according to the second embodiment may have the same construction as the non-volatile memory device according to the first embodiment illustrated in FIG. 1 except that it may further include the substrate insulating layers 304 and the pipe gate PG and the pipe channel layer CH3 may have different constructions from those of the first embodiment.

Furthermore, a method of operating the non-volatile memory device according to the second embodiment may be the same as that described above with reference to FIGS. 3 to 5, and thus a description thereof is omitted.

FIGS. 9A to 9F are diagrams illustrating a method of manufacturing the non-volatile memory device illustrated in FIG. 8.

Figure 9A:
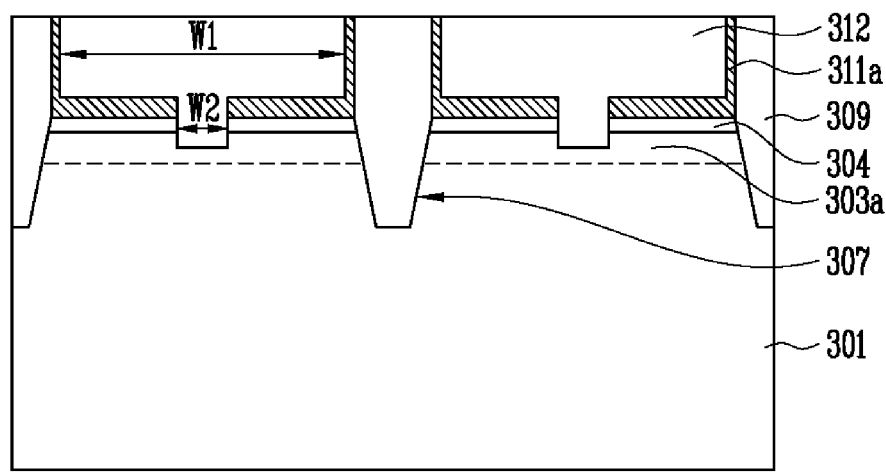

Referring to FIG. 9A, a first impurity region 303a may be formed by implanting P-type impurities substantially into the P-type semiconductor substrate 301 made of monocrystalline silicon, as descried above with reference to FIG. 6A. The first impurity region 303a may function as the well pick-up of the non-volatile memory device or may function to improve the supply of holes to the channel layer in an erase operation. Next, the substrate insulating layer 304 may be formed substantially over the semiconductor substrate 301.

As described above with reference to FIGS. 6B to 6D, after forming first hard mask patterns, isolation trenches 307 may be formed in the semiconductor substrate 301 by performing an etch process on the substrate insulating layer 304 and the semiconductor substrate 301. The isolation layers 309 may be formed in the respective isolation trenches 307.

The first hard mask patterns may be removed, and the first pipe gate layers 311a may be formed in respective regions from which the first hard mask patterns have been removed, substantially over the substrate insulating layers 304. After forming mask patterns for forming first trenches substantially over the first pipe gate layers 311a, the first pipe gate layers 311a generally exposed through the mask patterns for forming the first trenches may be substantially exposed to a specific depth. Thus, the first trench having a first width W1 may be formed in each of the first pipe gate layers 311a. The first pipe gate layer 311a may be a metal layer or a polysilicon layer. The mask patterns for forming the first trenches may be made of material having an etch selectivity to the first pipe gate layers 311a and may be removed after forming the first trenches.

Next, mask patterns for forming second trenches may be formed. The first pipe gate layers 311a and the substrate insulating layers 304 which may be formed under the first trenches may be exposed through the mask patterns for forming the second trenches. The second trenches generally extending from the first trenches to the semiconductor substrate 301 may be formed by etching the first pipe gate layers 311a and the substrate insulating layers 304 which may be exposed through the mask patterns for forming the second trenches. The mask patterns for forming the second trenches may be made of material having an etch selectivity to the first pipe gate layers 311a and the substrate insulating layers 304 and may be removed after forming the second trenches. Each of the second trenches may be formed at substantially the center of the bottom of the first trench and may be formed to have the semiconductor substrate 301 generally exposed therethrough. The second trench may have a second width W2 narrower than the first width W1. The processes of forming the first and the second trenches may be reversed. In other words, after forming the second trenches, the first trenches may be formed. Accordingly, pipe channel holes including the first and the second trenches may be formed in the first pipe gate layers 311a, respectively. Next, the insides of the pipe channel holes formed in the first pipe gate layers 311a may be substantially filled with sacrificial layer patterns 312. The sacrificial layer pattern 312 may be a nitride layer.

Figure 9B:
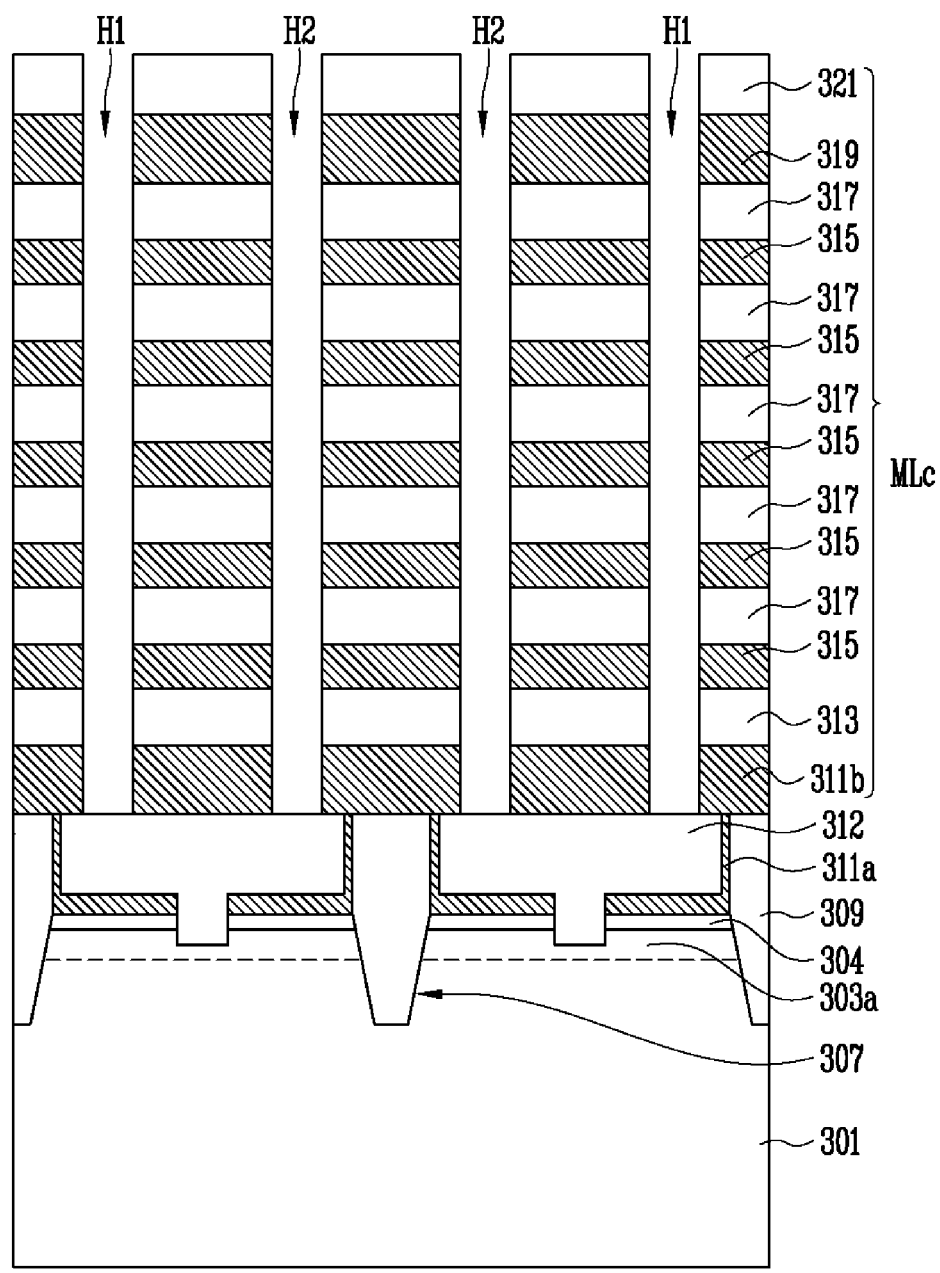

Referring to FIG. 9B, a plurality of first and second material layers may be alternately stacked to generally form a stack structure MLc substantially over the entire structure in which the sacrificial layer patterns 312 may be formed. The first material layers may be a plurality of conductive layers 311b, 315, and 319, and the second material layers may be a plurality of interlayer insulating layers 313, 317, and 321. The lowest layer of the plurality of interlayer insulating layers may be a pipe gate insulating layer 313, the lowest layer of the plurality of conductive layers may be the second pipe gate layer 311b, the highest layer of the plurality of conductive layers may be a select gate layer 319, and the conductive layers substantially between the second pipe gate layer 311b and the select gate layer 319 may be cell gate layers 315.

The number of each of the conductive layers and the interlayer insulating layers, of the stack structure MLc, may be different according to the number of memory cells to be stacked.

The plurality of conductive layers 311b, 315, and 319 may be metal layers or polysilicon layers. Furthermore, the plurality of interlayer insulating layers 313, 317, and 321 may be oxide layers.

Next, a plurality of first channel holes H1 and a plurality of second channel holes H2 may be formed by an etch process. The first channel holes H1 and the second channel holes H2 may be formed to substantially penetrate the stack structure MLc and to have the sacrificial layer patterns 312 generally exposed therethrough. Vertical holes, consisting of each of pairs of the first and the second channel holes H1 and H2, may be formed on both sides of each of the sacrificial layer patterns 312. Furthermore, the first and the second channel holes H1 and H2 may be formed substantially in parallel. In the etch process of forming the first and the second channel holes H1 and H2, the sacrificial layer patterns 312, that is, nitride layers may function as an etch-stop layer.

Figure 9C:
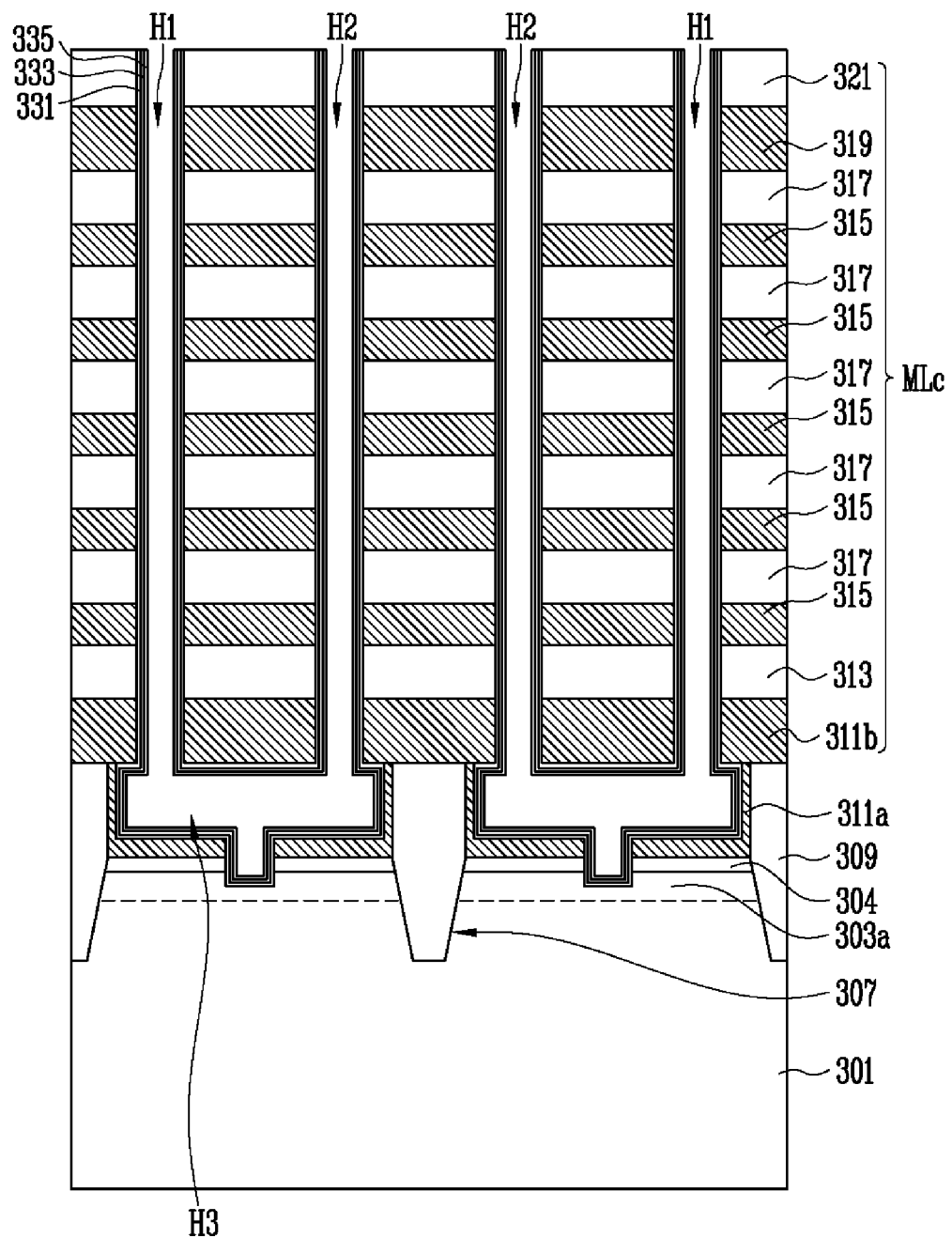

Referring to FIG. 9C, an etch material may be penetrated through the first and the second channel holes H1 and H2 in order to substantially strip the sacrificial layer patterns 312, thereby generally opening pipe channel holes H3 each coupling the pair of first and second channel holes H1 and H2. Thus, channel holes, each including the first and the second channel holes H1 and H2 and the pipe channel hole H3, may be formed.

After forming the channel holes, the first stack layer 331, the second stack layer 333, and the third stack layer 335 may be sequentially formed generally on the inner wall of the first and the second channel holes H1 and H2 and the pipe channel hole H3. The stack layers including the first to third stack layers 331, 333, and 335 may be formed by sequentially stacking an oxide layer, a nitride layer, and an oxide layer or may be formed of thin dielectric layers of multiple layers having a high dielectric constant.

Referring to FIG. 9D, a semiconductor layer 337 substantially filing the first and the second channel holes H1 and H2 may be formed, thus forming the first vertical channel layers CH1 and the second vertical channel layers CH2. The first vertical channel layers CH1 and the second vertical channel layers CH2 may be formed to have respective outer walls substantially surrounded by the stack layers 331, 333, and 335 and to generally penetrate the stack structure MLc. The first vertical channel layer CH1 may be formed within the first channel hole H1 (see FIG. 9C), and the second vertical channel layer CH2 may be formed within the second channel hole H2. Meanwhile, the semiconductor layer 337 may be formed substantially on the inner walls of the pipe channel holes H3 without substantially filling the pipe channel holes H3.

Figure 9E:
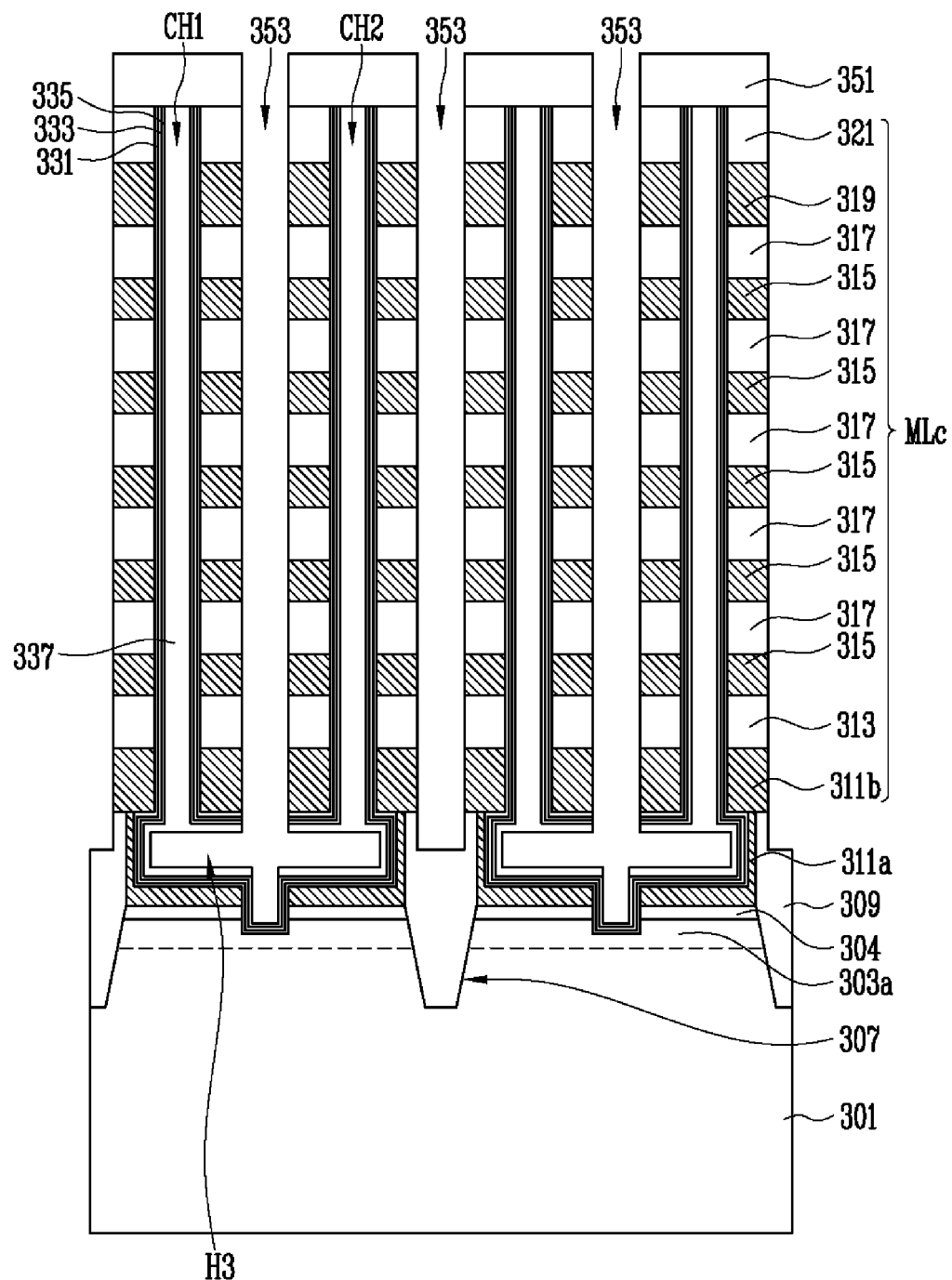

Referring to FIG. 9E, second hard mask patterns 351 may be formed substantially over the entire structure in which the first and the second vertical channel layers CH1 and CH2 are formed, by performing a photolithography process. A region substantially between the first and the second vertical channel layers CH1 and CH2, a region substantially between the first vertical channel layers CH1 generally adjacent to each other, and a region substantially between the second vertical channel layers CH2 generally adjacent to each other may be generally exposed in a line form substantially parallel to the Y direction through the second hard mask patterns 351. The stack structure MLc, the stack layers 331, 333, and 335, the semiconductor layer 337, and the substrate insulating layers 304 may be etched by an etch process using the second hard mask patterns 351 as an etch mask.

Accordingly, the slit 353 may be formed substantially between the first and the second vertical channel layers CH1 and CH2. The slits 353 may be formed to substantially penetrate the stack structure MLc, the semiconductor layer 337, the stack layers 331, 333, and 335, and the substrate insulating layers 304 and may be generally extended down to the semiconductor substrate 301. In particular, the slit 353 formed substantially between the first and the second vertical channel layers CH1 and CH2 may substantially penetrate the semiconductor layer 337 within each of the second trenches illustrated in FIG. 9A. A part of the slit 353 generally extending from the second trench to the semiconductor substrate 301 may be hereinafter referred to as the extending part of the slit 353. The semiconductor substrate 301, in particular, the first impurity region 303a of the semiconductor substrate 301 may be generally exposed through the extending part of the slit 353. Meanwhile, each of some of the slits 353 may be formed substantially between the first vertical channel layers CH1 generally adjacent to each other and substantially between the second vertical channel layers CH2 generally adjacent to each other, formed to substantially penetrate the stack structure MLc, and generally extended down to the isolation layer 309.

Figure 9F:
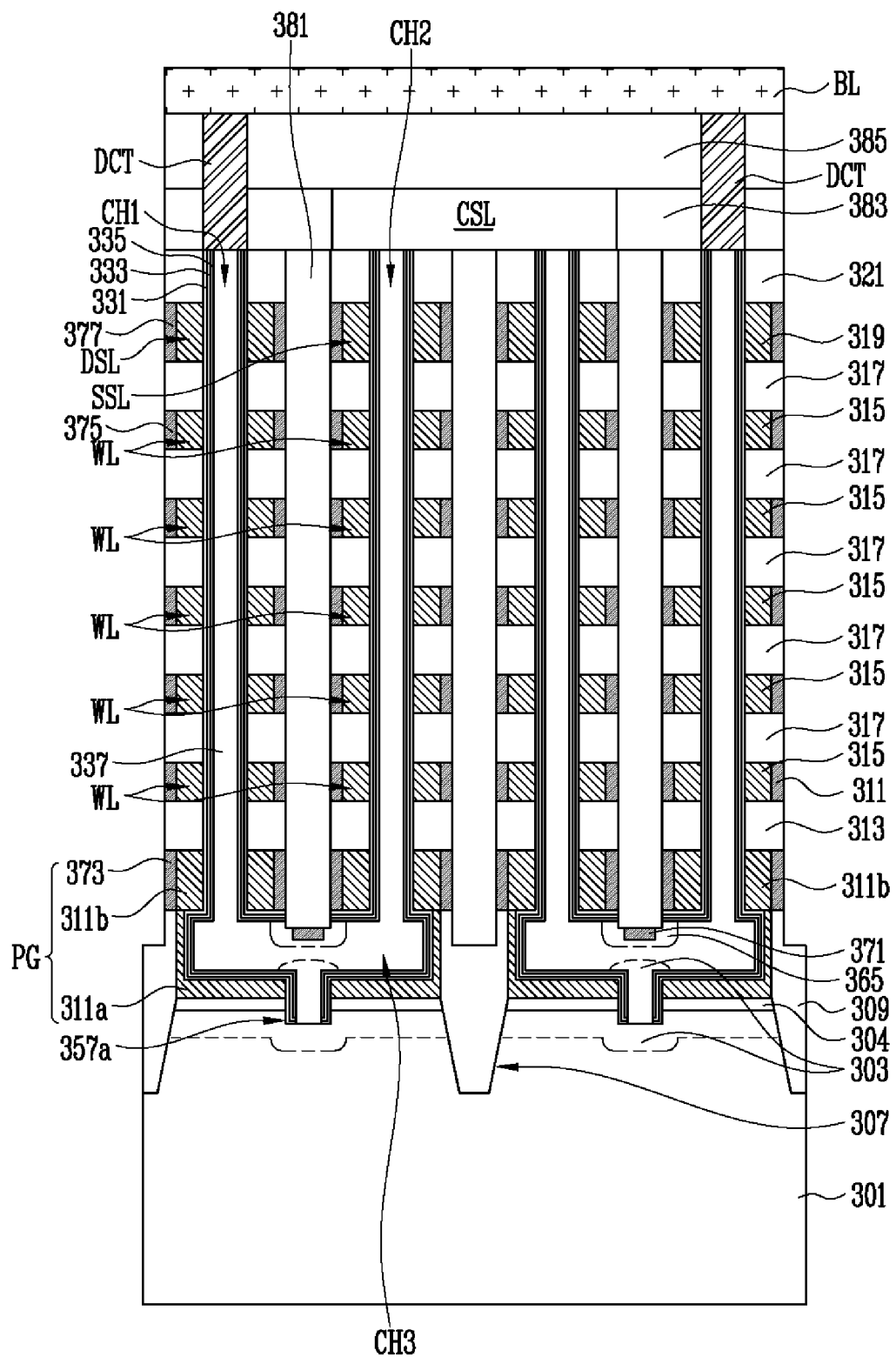

Referring to FIG. 9F, the channel layer extension parts 357a may be formed as described above with reference to FIGS. 6I to 6J. The channel layer extension parts 357a may be coupled to the respective pipe channel layers CH3, substantially filling the pipe channel holes H3 and substantially filling the extending parts of the slits 353, and are coupled to the semiconductor substrate 301. Next, as described above with reference to FIG. 6J, the second impurity regions 303, that is, P-type impurity regions may be formed in a surface of the semiconductor substrate 301 and in the respective channel layer extension parts 357a by additionally implanting P-type impurities.

Next, as descried above with reference to FIG. 6K, the third impurity regions 365, that is, the N-type impurity region may be formed in a surface of each of the pipe channel layers CH3 opened through the slit 353 by implanting N-type impurities through the opening region of the slit 353.

Meanwhile, a silicidation process may be further performed in order to form a metal silicide layer for improving the RC delay of the word lines WL, the select lines DSL and SSL, and the pipe gates PG of the non-volatile memory device formed substantially of a polysilicon layer and for improving channel resistance, as described above with reference to FIGS. 6K and 6I. Thus, the source select line SSL and the drain select line DSL, each including the polysilicon layer 319 for a select gate and a metal silicide layer 377 formed generally on the sidewall of the polysilicon layer 319, may be formed. Furthermore, the word lines WL, each including the polysilicon layer 315 for a cell gate and a metal silicide layer 375 formed substantially on the sidewall of the polysilicon layer 315, may be formed. Furthermore, the metal silicide layer 371 may be formed on a surface of the pipe channel layer CH3 generally exposed through the slit 353 and substantially on the sidewall of the second pipe gate layer 311b.

Next, interlayer insulating layers 381, 383, and 385, the common source line CSL, the drain contact plugs DCT, and the bit lines BL may be formed by performing subsequent processes, as descried above with reference to FIGS. 6M and 6O.

Figure 10A:
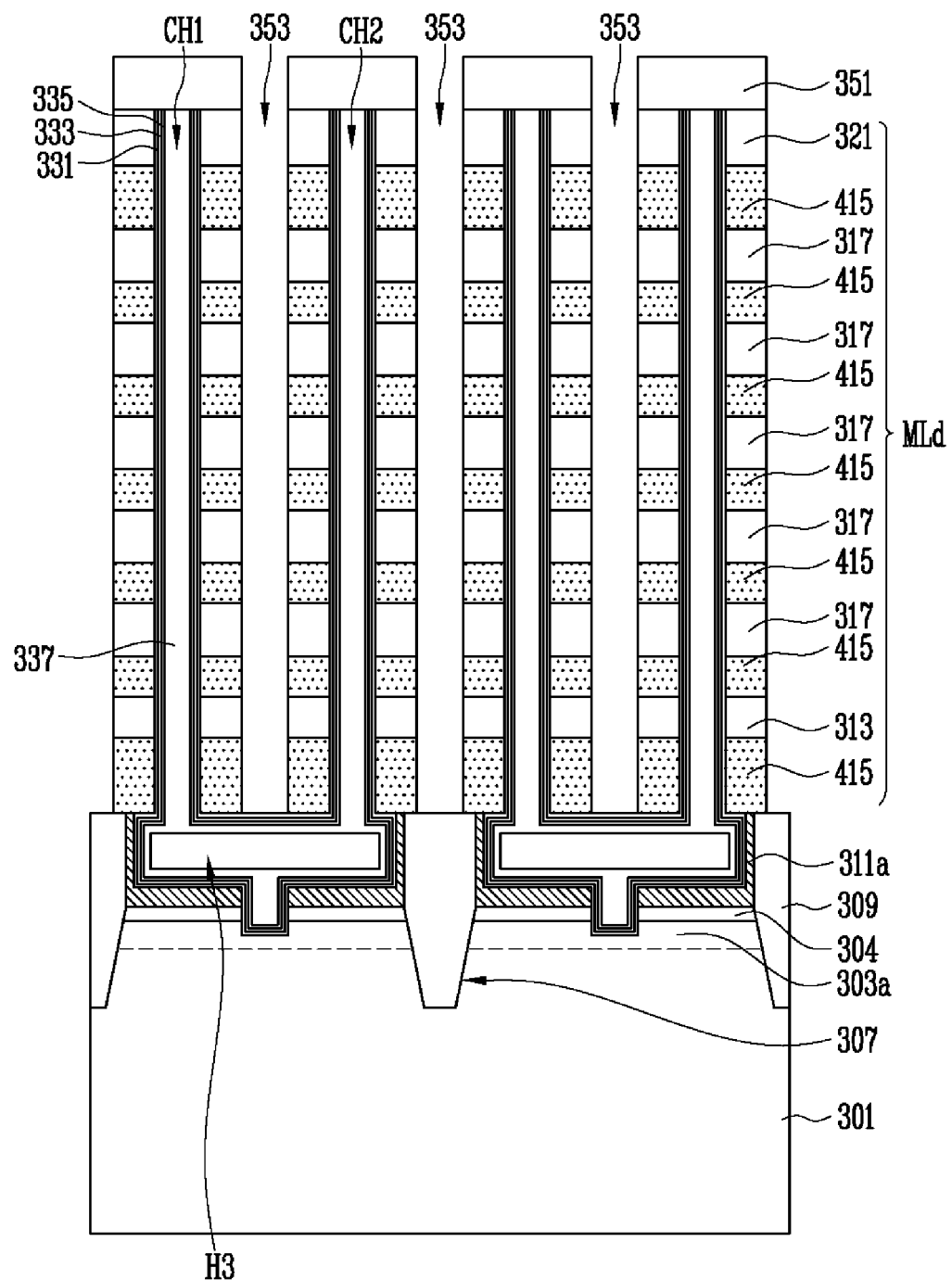
Figure 10B:
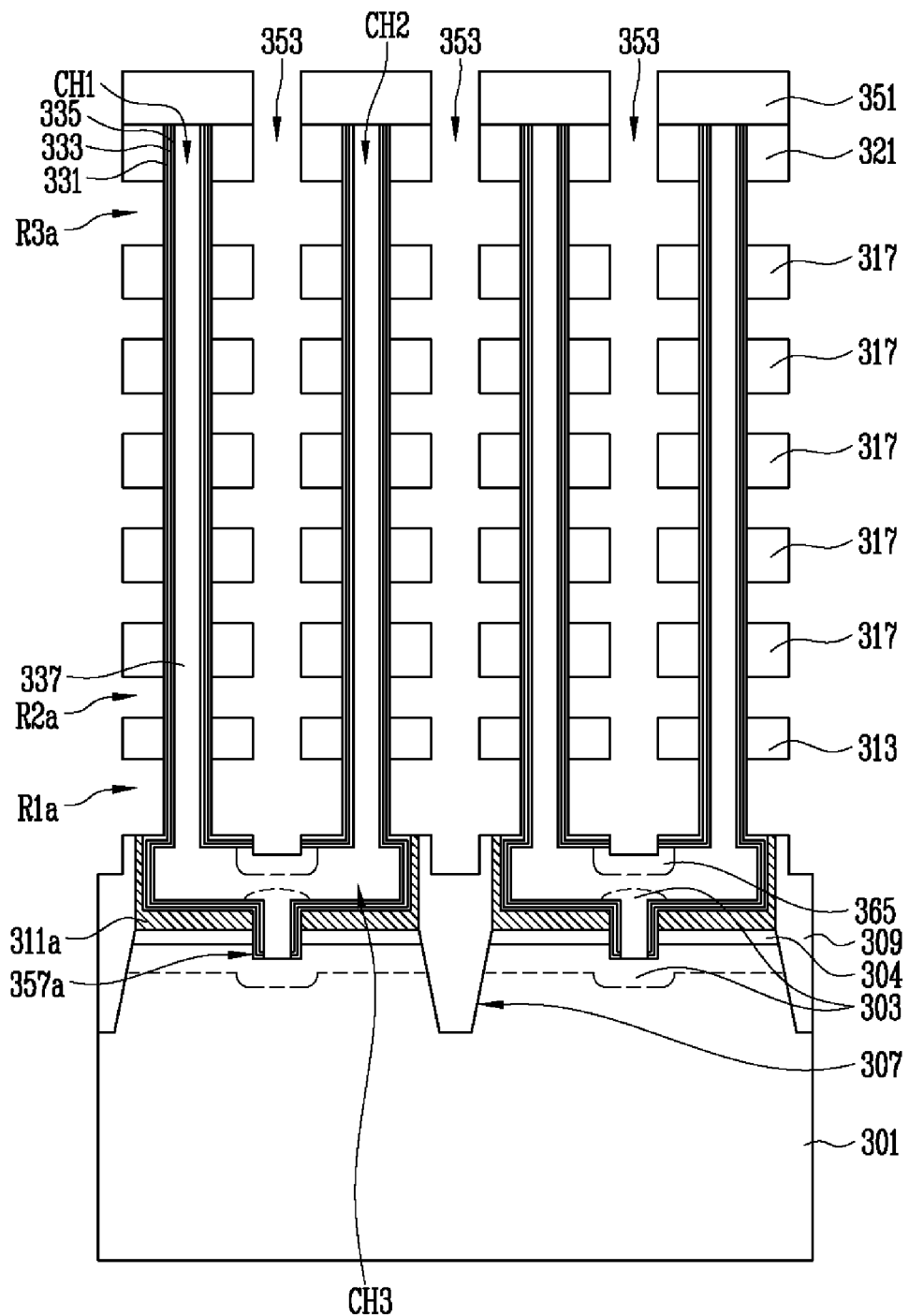

FIGS. 10A to 10C are diagrams illustrating another method of manufacturing the non-volatile memory device illustrated in FIG. 8.

Referring to FIG. 10A, underlying structures, including the first impurity region 303a, the substrate insulating layers 304, the first pipe gate layers 311a, the pipe channel holes including the first and the second trenches, the sacrificial layer patterns 312, the isolation trenches 307, and the isolation layers 309, may be formed, as descried above with reference to FIG. 9A. The first pipe gate layer 311a may be formed substantially over the semiconductor substrate 301 with the substrate insulating layer 304 interposed therebetween. The pipe channel holes may include the first trench formed substantially within the first pipe gate layer 311a and the second trench formed generally at the bottom of the first trench and formed to have the first impurity region 303a generally exposed therethrough. The sacrificial layer pattern 312 may be formed substantially within the pipe channel hole. The isolation trench 307 and the isolation layer 309 may be formed substantially in the isolation region of the semiconductor substrate 303.

Next, a stack structure MLd may be formed substantially over the entire structure in which the sacrificial layer patterns 312 may be formed, by alternately stacking a plurality of first and second material layers. The first material layers may be a plurality of sacrificial layers 415, and the second material layers may be the plurality of interlayer insulating layers 313, 317, and 321. The lowest layer of the plurality of interlayer insulating layers 313, 317, and 321 may be the pipe gate insulating layer 313. The number of each of the sacrificial layers and the interlayer insulating layers of the stack structure MLd may be different according to the number of memory cells to be stacked.

The plurality of interlayer insulating layers 313, 317, and 321 may be oxide layers, and the plurality of sacrificial layers 415 may be nitride layers having an etch selectivity to the interlayer insulating layers 313, 317, and 321.

Next, the plurality of first channel holes and the plurality of second channel holes may be formed by an etch process. The plurality of first channel holes and the plurality of second channel holes may be formed to substantially penetrate the stack structure MLd and to have the sacrificial layer patterns generally within the pipe channel holes generally exposed therethrough. Substantially vertical holes, including each of pairs of the first and the second channel holes, may be formed on both sides of each of the pipe channel holes. Furthermore, the first and the second channel holes may be formed generally in parallel.

Next, a passivation layer may be formed substantially on the sidewalls of the first and the second channel holes. It may be preferred that the passivation layer be made of material having an etch selectivity to the sacrificial layer patterns generally within the pipe channel holes and the interlayer insulating layers 313, 317, and 321 and the sacrificial layers 415 of the stack structure MLd. For example, the passivation layer may be a TiN layer having an etch selectivity to a nitride layer and an oxide layer, etc.

Next, the pipe channel holes each coupling the first and the second channel holes may be generally opened by substantially stripping the sacrificial layer patterns generally within the pipe channel holes, as described above with reference to FIG. 9C. Thus, channel holes, each configured to include the first and the second channel holes H1 and H2 and the pipe channel hole H3 and to have the semiconductor substrate 301 generally exposed therethrough may be formed.

After forming the channel holes, the passivation layer may be substantially removed. Next, as descried above with reference to FIG. 9D, the stack layers 331, 333, and 335 may be formed generally on the inner walls of the channel holes H1, H2, and H3 and the semiconductor layer 337 substantially filling the insides of the first and the second channel holes may be formed, thereby forming the first and the second vertical channel layers CH1 and CH2.

Next, the second hard mask patterns 351 may be formed, as descried above with reference to FIG. 9E. A region substantially between the first and the second vertical channel layers CH1 and CH2, a region substantially between the first vertical channel layers CH1 generally adjacent to each other, and a region substantially between the second vertical channel layers CH2 generally adjacent to each other may be generally exposed through the second hard mask patterns 351 generally in a line form substantially parallel to the Y direction. The stack structure MLd, the stack layers 331, 333, and 335, and the semiconductor layer 337 may be etched by an etch process using the second hard mask patterns 351 as an etch mask.

Accordingly, the slit 353 may be formed substantially between the first and the second vertical channel layers CH1 and CH2. The slits 353 may be formed to substantially penetrate the stack structure MLd, the semiconductor layer 337, and the stack layers 331, 333, and 335 and may be extended down to the semiconductor substrate 301. In particular, the slit 353 formed substantially between the first and the second vertical channel layers CH1 and CH2 may substantially penetrate the semiconductor layer 337 within the second trench in FIG. 10A and extend down to the semiconductor substrate 301, so that the first impurity region 303a may be generally exposed through the slit 353. Meanwhile, each of some of the slits 353 may be formed substantially between the first vertical channel layers CH1 generally adjacent to each other and substantially between the second vertical channel layers CH2 generally adjacent to each other, formed to substantially penetrate the stack structure MLd, and extended down to the isolation layer 309.

Referring to FIG. 10B, the extending parts of the slits 353, generally extending from the pipe channel holes H3 and the second trenches to the semiconductor substrate 301, may be substantially filled with the polysilicon layer 357 by growing the polysilicon layer 357, that is, the semiconductor layer using an SEG method. Accordingly, the polysilicon layer 357 may be formed generally within the pipe channel holes H3 and the extending parts of the slits 353, thereby forming the pipe channel layers CH3, each coupling a pair of the first and second vertical channel layers CH1 and CH2, and the channel layer extension parts 357a, each generally extending from the pipe channel layer CH3 to the semiconductor substrate 301.

The channel layers according to the present embodiment may be coupled to the semiconductor substrate 301 through the respective channel layer extension parts 357a.

After forming the channel layers, the second impurity regions 303, that is, the P-type impurity regions may be formed generally on a surface of the semiconductor substrate 301 by additionally implanting P-type impurities through the opening regions of the slits 353, as descried above with reference to FIG. 6J. The second impurity regions 303 may also be formed substantially within the channel layer extension parts 357a coupled to the semiconductor substrate 301.

Furthermore, as descried above with reference to FIG. 6K, the third impurity region 365, that is, the N-type impurity region may be formed in a surface of the pipe channel layer CH3 substantially opened through the slit 353 by implanting N-type impurities through the opening region of the slit 353.

Next, recess regions R1a, R2a, and R3a may be formed by substantially removing the sacrificial layers 415 generally exposed through the slits 353. The highest one (that is, the recess region R3a) of the recess regions R1a, R2a, and R3a may be a region where the select gate layer may be formed. The lowest one (that is, the recess region R1a) of the recess regions R1a, R2a, and R3a may be a region where the second pipe gate layers 311b may be formed. The recess regions R2a substantially between the recess region R3a and the recess region R1a may be regions where the cell gate layers may be formed.

Referring to FIG. 10C, the second pipe gate layers 311b, the cell gate layers 315, and the select gate layers 319 may be formed by substantially filling the recess regions R1a, R2a, and R3a with a conductive layer. The conductive layer may be a metal layer or a polysilicon layer.

Next, the metal silicide layers 371, 373, 375, and 377 may be formed by performing a silicidation process. If the conductive layer formed to substantially fill the recess regions R1a, R2a, and R3a is a polysilicon layer, the sidewalls of the second pipe gate layers 311b, the cell gate layers 315 and the select gate layers 319 may be silicided to a specific thickness by the silicidation process.

After forming the word lines WL and the drain and source select lines DSL and SSL as described above, the interlayer insulating layers 381, 383, 385, the common source line CSL, the drain contact plugs DCT, and the bit lines BL may be formed by subsequent processes, as descried above with reference to FIG. 6M and FIG. 6O.

Figure 11:
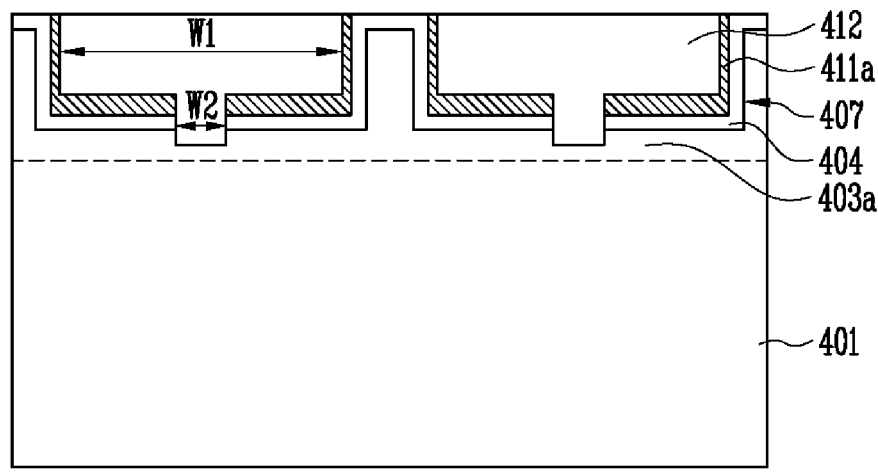
FIG. 11 is a diagram illustrating a non-volatile memory device and a method of manufacturing the same according to a third embodiment of this disclosure.

FIG. 11 is a diagram illustrating a non-volatile memory device and a method of manufacturing the same according to a third embodiment of this disclosure. The non-volatile memory device of the third embodiment may have the same construction as the non-volatile memory device of the second embodiment except for the structures under the second pipe gate. Accordingly, structures formed under the second pipe gate and a method of the same are chiefly described below, for simplicity.

Referring to FIG. 11, a first impurity region 403a may be formed by implanting P-type impurities into a P-type semiconductor substrate 401 made of monocrystalline silicon, as descried above with reference to FIG. 6A. The first impurity region 403a may function as the well pick-up of the non-volatile memory device or may function to improve the supply of holes to the channel layer in an erase operation.

Pipe trenches 407 may be formed by etching the semiconductor substrate 401. A substrate insulating layer 404 may be formed generally on a surface of the semiconductor substrate 401 including the pipe trenches 407. First pipe gate layers 411a may be formed generally on the substrate insulating layer 404 so that the pipe trenches are substantially filled. First trenches, each having a first width W1, may be formed generally in the first pipe gate layers 411a by etching the first pipe gate layers 411a to a specific depth. The first pipe gate layers 411a may be metal layers or polysilicon layers. Furthermore, second trenches may be formed by etching the first pipe gate layers 411a, generally exposed through the bottoms of the first trenches, and the substrate insulating layers 404. The second trenches may be generally extended from the first trenches to the semiconductor substrate 401. Each of the second trenches may be formed generally at the center of the bottom of the first trench and may be formed to have a second width W2 narrower than the first width W1. The semiconductor substrate 401 may be generally exposed through the second trenches. Accordingly, pipe channel holes, each including the first and the second trenches, may be formed substantially within the first pipe gate layers 411a, respectively. A detailed process of the first and the second trenches may be the same as that described with reference to FIG. 9A. Next, the pipe channel holes formed in the first pipe gate layers 411a may be substantially filled with sacrificial layer patterns 412. The sacrificial layer patterns 412 may be nitride layers.

Subsequent processes performed after forming the sacrificial layer patterns 412 may be the same as those described with reference to FIGS. 9B to 9F or FIGS. 10A to 10C, and a description thereof is omitted, for simplicity.

In accordance with this disclosure, the channel layers of the generally U-shaped memory strings may be coupled to the semiconductor substrate so that holes may be supplied to the channel layers in an erase operation. Accordingly, Gate Induced Drain Leakage (GIDL) does not need to be induced on the select gate side in order to supply holes to the channel layers in an erase operation. Accordingly, the erase speed and the reliability of the select gate can be improved because the waveforms of erase operation signals of the non-volatile memory device are simplified.

What is claimed is:

1. A non-volatile memory device, comprising:
a first vertical channel layer and a second vertical channel layer, both of which, generally protrude upwardly from a semiconductor substrate substantially in parallel;
a first gate group configured to include a plurality of memory cell gates which are stacked substantially along the first vertical channel layer and are isolated from each other with an interlayer insulating layer interposed substantially between the memory cell gates;
a second gate group configured to include a plurality of memory cell gates which are stacked substantially along the second vertical channel layer and are isolated from each other with the interlayer insulating layer interposed substantially between the memory cell gates;

a pipe channel layer above the semiconductor substrate and configured to couple the first vertical channel layer and the second vertical channel layer; and stack layers formed along outer walls of the first vertical channel layer, the second vertical channel layer and the pipe channel layer, wherein the pipe channel layer includes an extension part passing through the stack layers and coupled to the semiconductor substrate.

2. The non-volatile memory device of claim 1, further comprising:

a first pipe gate formed on the pipe channel layer to substantially surround the first vertical channel layer; and a second pipe gate formed on the pipe channel layer to substantially surround the second vertical channel layer.

3. The non-volatile memory device of claim 1, further comprising:

a first pipe gate formed to substantially surround the pipe channel layer; and a second pipe gate over the pipe channel layer to substantially surround the first vertical channel layer and the second vertical channel layer.

4. The non-volatile memory device of claim 3, wherein the first pipe gate is formed substantially within the semiconductor substrate or generally over the semiconductor substrate.

5. The non-volatile memory device of claim 1, further comprising a P-type impurity region formed within the extension part of the pipe channel layer and a surface of the semiconductor substrate.

6. The non-volatile memory device of claim 1, further comprising a first impurity region formed within the extension part of the pipe channel layer.

7. The non-volatile memory device of claim 6, wherein the first impurity region is a P-type impurity region.

8. The non-volatile memory device of claim 1, further comprising a second impurity region formed within a surface of the pipe channel layer substantially between the first and the second gate groups.

9. The non-volatile memory device of claim 8, wherein the second impurity region is an N-type impurity region.

10. The non-volatile memory device of claim 1, further comprising a metal silicide layer formed substantially in a surface of the pipe channel layer substantially between the first and the second gate groups.

11. The non-volatile memory device of claim 1, further comprising a metal silicide layer formed generally on sidewalls of the memory cell gates.

* * * * *